US012703910B2

(12) United States Patent
Ikeda

(10) Patent No.: US 12,703,910 B2
(45) Date of Patent: Aug. 11, 2026

(54) FILM FORMATION APPARATUS AND FILM FORMATION METHOD OF GALLIUM NITRIDE FILM

(71) Applicant: Japan Display Inc., Tokyo (JP)

(72) Inventor: Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 19/017,901

(22) Filed: Jan. 13, 2025

(65) Prior Publication Data

US 2025/0146127 A1 May 8, 2025

Related U.S. Application Data

(63) Continuation of application No. PCT/JP2023/020436, filed on Jun. 1, 2023.

(30) Foreign Application Priority Data

Jul. 25, 2022 (JP) ................................ 2022-117849

(51) Int. Cl.
*C23C 14/58* (2006.01)
*C03C 17/22* (2006.01)
(Continued)

(52) U.S. Cl.
CPC ........ *C23C 14/5873* (2013.01); *C03C 17/225* (2013.01); *C23C 14/0617* (2013.01); *C23C 14/3407* (2013.01); *C23C 14/50* (2013.01); *C23C 14/541* (2013.01); *H01J 37/32449* (2013.01); *H01J 37/3426* (2013.01);
(Continued)

(58) Field of Classification Search
CPC ........... C23C 14/5873; C23C 14/0617; C23C 14/3407; C23C 14/50; C23C 14/541; C23C 14/0057; C23C 14/0063; C03C 17/225; C03C 2217/281; C03C 2218/154; C03C 2218/33; C03C 2218/155; H01J 37/32449; H01J 37/3426; H01J 37/3464; H01J 37/3476; H01J 2237/332; H10P 14/22; H10P 14/2922; H10P 14/3416
USPC ........... 204/298.26, 298.03, 192.12, 192.15, 204/192.25
See application file for complete search history.

(56) References Cited

FOREIGN PATENT DOCUMENTS

JP 2013125851 A * 6/2013
JP 2020164927 A 10/2020

OTHER PUBLICATIONS

Machine Translation JP 2013125851 (Year: 2013).*

* cited by examiner

*Primary Examiner* — Rodney G Mcdonald
(74) *Attorney, Agent, or Firm* — Maier & Maier, PLLC

(57) ABSTRACT

A film formation apparatus includes a vacuum chamber, a substrate support portion for supporting a substrate, a target support portion for supporting a target containing nitrogen and gallium, a sputtering gas supply unit for supplying a sputtering gas, a sputtering power source for applying a voltage to the target, a first radical supply source for supplying nitrogen radicals and hydrogen radicals, and a control unit. The control unit controls the sputtering gas supply unit, the sputtering power source, and the first radical supply source so that a first period in which the sputtering gas, the nitrogen radicals, and the hydrogen radicals are supplied to the vacuum chamber and a voltage is applied to the target and a second period in which the nitrogen radicals and the hydrogen radicals are not supplied to the vacuum chamber and a voltage is applied to the target are repeated.

12 Claims, 15 Drawing Sheets

(51) Int. Cl.

| | |
|---|---|
| ***C23C 14/06*** | (2006.01) |
| ***C23C 14/34*** | (2006.01) |
| ***C23C 14/50*** | (2006.01) |
| ***C23C 14/54*** | (2006.01) |
| ***H01J 37/32*** | (2006.01) |
| ***H01J 37/34*** | (2006.01) |
| ***H10P 14/20*** | (2026.01) |
| ***H10P 14/22*** | (2026.01) |

(52) U.S. Cl.

CPC ...... *H01J 37/3464* (2013.01); *H01J 37/3476* (2013.01); *H10P 14/22* (2026.01); *H10P 14/2922* (2026.01); *H10P 14/3416* (2026.01); *C03C 2217/281* (2013.01); *C03C 2218/154* (2013.01); *C03C 2218/33* (2013.01); *H01J 2237/332* (2013.01)

FILM FORMATION APPARATUS AND FILM FORMATION METHOD OF GALLIUM NITRIDE FILM

CROSS-REFERENCE TO RELATED APPLICATIONS

This application is a Continuation of International Patent Application No. PCT/JP2023/020436, filed on Jun. 1, 2023, which claims the benefit of priority to Japanese Patent Application No. 2022-117849, filed on Jul. 25, 2022, the entire contents of which are incorporated herein by reference.

FIELD

An embodiment of the present invention relates to a film formation apparatus for forming a gallium nitride film. Further, an embodiment of the present invention relates to a method for forming a gallium nitride film.

BACKGROUND

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

In recent years, a so-called micro LED display device and a mini LED display device in which minute LED chips are mounted in pixels of a circuit substrate have been developed as next-generation display devices. The LED is a self-light emitting element similar to the OLED, but unlike OLED, the LED is composed of stable inorganic compounds containing gallium (Ga) or indium (In), and therefore, it is easy to ensure high reliability of the micro LED display device as compared with the OLED display device. In addition, the LED has high light emission efficiency and high brightness can be realized. Therefore, the micro LED display device is expected to be a next-generation display with high reliability, high brightness, and high contrast.

A gallium nitride film used in the micro LED and the like is generally formed on a sapphire substrate by Metal Organic Chemical Vapor deposition (MOCVD) or Hydride Vapor Phase Epitaxy (HVPE) at a high temperature of 800° C. to 1000° C. Recently, however, the formation of the gallium nitride film by sputtering, which can be formed at relatively low temperatures, has been developed (for example, see Japanese laid-open patent publication No. 2020-164927).

SUMMARY

A film formation apparatus according to an embodiment of the present invention includes a vacuum chamber capable of evacuating an interior thereof, a substrate support portion provided in the vacuum chamber and configured to support a substrate, a target support portion provided in the vacuum chamber and configured to support a target containing nitrogen and gallium, a sputtering gas supply unit connected to the vacuum chamber and configured to supply a sputtering gas to the vacuum chamber, a sputtering power source configured to apply a voltage to the target, a first radical supply source connected to the vacuum chamber and configured to be capable of supplying nitrogen radicals and hydrogen radicals to the vacuum chamber, and a control unit configured to control the sputtering gas supply unit, the sputtering power source, and the first radical supply source. The control unit controls the sputtering gas supply unit, the sputtering power source, and the first radical supply source so that a first period in which the sputtering gas, the nitrogen radicals, and the hydrogen radicals are supplied to the vacuum chamber and a voltage is applied to the target and a second period in which the nitrogen radicals and the hydrogen radicals are not supplied to the vacuum chamber and a voltage is applied to the target are repeated.

A film formation method of a gallium nitride film according to an embodiment of the present invention includes the steps of placing a substrate so as to face a target containing nitride and gallium in a vacuum chamber, heating the substrate, in a first period, supplying nitride radicals and hydrogen radicals to the vacuum chamber, supplying a sputtering gas to the vacuum chamber in the first period, and applying a voltage to the target to generate a plasma of the sputtering gas in the first period, in a second period, supplying chlorine radicals to the vacuum chamber, and applying a voltage to the target to etch an amorphous region of a gallium nitride film deposited on the substrate in the first period.

DESCRIPTION OF EMBODIMENTS

Figure 1:
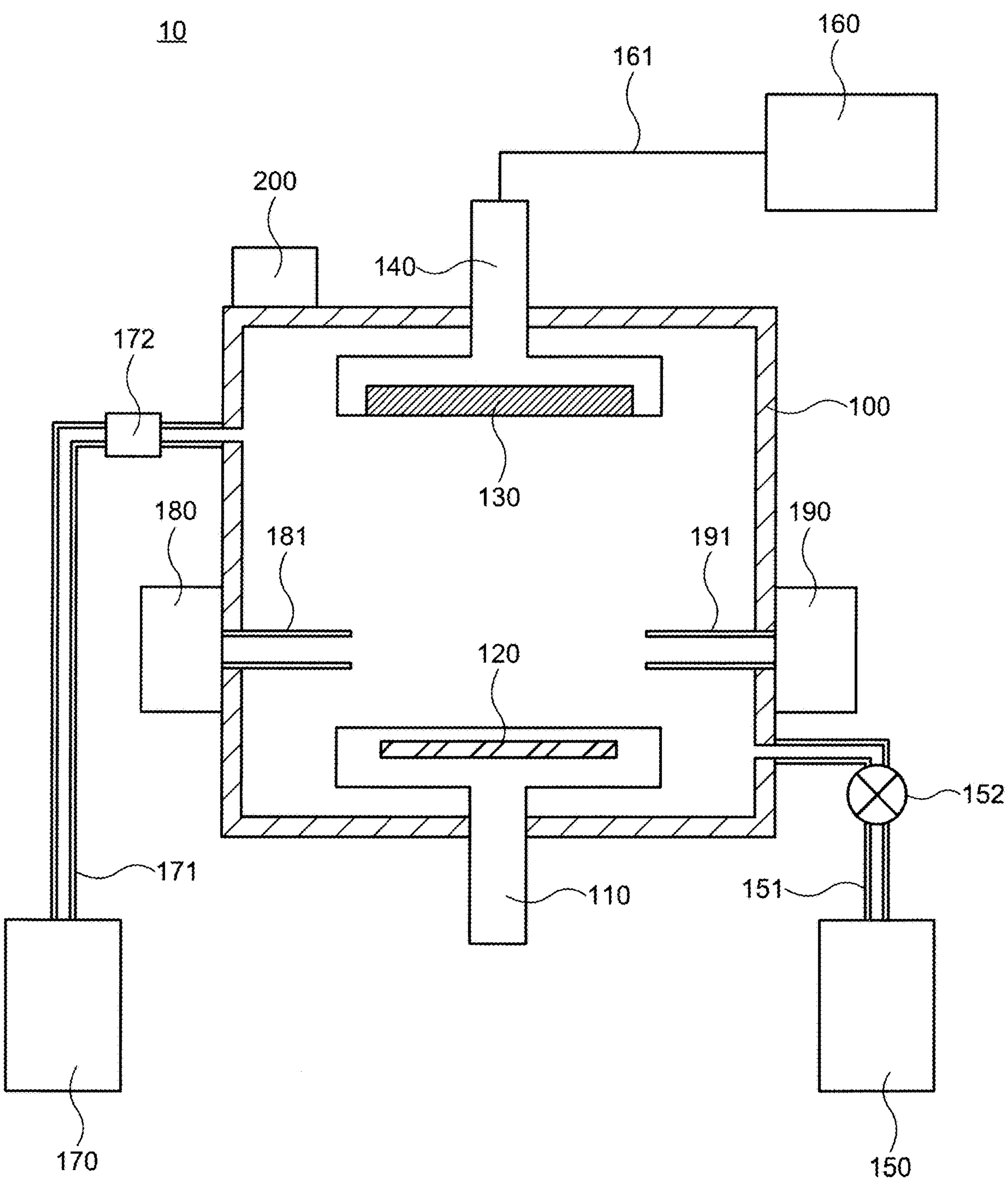
FIG. 1 is a schematic diagram showing a configuration of a film forming apparatus according to an embodiment of the present invention.

When a gallium nitride film is formed at a low temperature, it is possible to form a micro-LED directly on a glass substrate. However, it has not been possible to obtain a gallium nitride film with sufficient quality formed by sputtering.

In view of the above problems, an embodiment of the present invention can provide a film formation apparatus that can form a gallium nitride film at a low temperature. Further, an embodiment of the present invention can provide a method for forming a high-quality gallium nitride film.

Hereinafter, each of the embodiments of the present invention is described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expression "a includes A, B, or C," "a includes any of A, B, or C," "a includes one selected from a group consisting of A, B and C," and the like does not exclude the case where a includes a plurality of combinations of A to C unless otherwise specified. Further, these expressions do not exclude the case where a includes other components.

In the present specification, although the phrase "on" or "over" or "under" or "below" is used for convenience of explanation, in principle, the direction from a substrate toward a structure is referred to as "on" or "over" with reference to a substrate in which the structure is formed. Conversely, the direction from the structure to the substrate is referred to as "under" or "below." Therefore, in the expression of "a structure over a substrate," one surface of the structure in the direction facing the substrate is the bottom surface of the structure and the other surface is the upper surface of the structure. In addition, the expression of "a structure over a substrate" only explains the vertical relationship between the substrate and the structure, and another member may be placed between the substrate and the structure. Furthermore, the term "on" or "over" or "under" or "below" means the order of stacked layers in the structure in which a plurality of layers is stacked, and may not be related to the position in which layers overlap in a plan view.

In the specification, terms such as "first," "second," or "third" attached to each configuration are convenient terms used to distinguish each component, and have no further meaning unless otherwise explained.

In the specification and the drawings, the same reference numerals may be used when multiple components are identical or similar in general, and reference numerals with a lower or upper case letter of the alphabet may be used when the multiple components are distinguished. Further, reference numerals with a hyphen and a natural number may be used when multiple portions of one component are distinguished.

In the specification, a cation and an anion may be referred to as a positive ion and a negative ion, respectively.

The following embodiments can be combined with each other as long as there is no technical contradiction.

First Embodiment

A film formation apparatus 10 of a gallium nitride film according to an embodiment of the present invention is described with reference to FIGS. 1 to 9.

[1. Configuration of Film Formation Apparatus 10]

FIG. 1 is a schematic diagram showing a configuration of a film formation apparatus 10 according to an embodiment of the present invention.

As shown in FIG. 1, the film formation apparatus 10 includes a vacuum chamber 100, a substrate support portion 110, a heating unit 120, a target 130, a target support portion 140, a pump 150, a sputtering power source 160, a sputtering gas supply unit 170, a first radical supply source 180, a second radical supply source 190, and a control unit 200.

The substrate support portion 110, the heating unit 120, the target 130, and the target support portion 140 are provided in the vacuum chamber 100. The substrate support portion 110 and the heating unit 120 are provided at a lower part in the vacuum chamber 100. A substrate is placed on the substrate support portion 110. In the film formation apparatus, a glass substrate or a quartz substrate can be used as the substrate. Further, a glass substrate or a quartz substrate on which an aluminum nitride film is formed can be used as the substrate. The heating unit 120 is provided in the substrate support 110 and is capable of heating the substrate placed on the substrate support portion 110 at a predetermined temperature. The predetermined temperature is, for example, higher than or equal to 400° C. and lower than or equal to 600° C. The target 130 and the target support portion 140 are provided at an upper part in the vacuum chamber 100. The target 130 is supported by the target support portion 140 and is provided to face the substrate placed on the substrate support portion 110.

In addition, although FIG. 1 shows a configuration in which the substrate support portion 110 and the heating unit 120 are provided at the lower part in the vacuum chamber 100 and the target 130 and the target support portion 140 are provided at the upper part in the vacuum chamber 100, these positions may be reversed.

The target 130 is gallium nitride containing nitrogen and gallium. In the composition ratio of the gallium nitride in the target 130, it is preferable that gallium with respect to nitrogen is greater than or equal to 0.5 and less than or equal to 2. The nitrogen of the gallium nitride film formed on the substrate is supplied from the target 130 and the first radical supply source 180, while the gallium of the gallium nitride film is supplied only from the target 130. Therefore, it is preferable that the composition of the gallium nitride of the target 130 contains more gallium than nitrogen. Further, the target support portion 140 is preferably an yttria-based material having corrosion resistance to chlorine, which is an etching gas (a second gas) described later.

The pump 150, the sputtering power source 160, the sputtering gas supply unit 170, the first radical supply source 180, and the second radical supply source 190 are provided outside the vacuum chamber 100.

The pump 150 is connected to the vacuum chamber 100 through a pipe 151. The pump 150 can exhaust gas from the vacuum chamber 100 through the pipe 151. That is, the inside of the vacuum chamber 100 can be evacuated by the pump 150 connected to the vacuum chamber 100 so as to be lower than or equal to a predetermined degree of vacuum. Although the predetermined degree of vacuum is, for example, $10^{-6}$ Pa, the degree of vacuum is not limited thereto. Further, the pressure in the vacuum chamber 100 can be kept constant by opening and closing a valve 152 connected to the pipe 151. For example, a turbo molecular pump or a cryopump can be used as the pump 150.

The sputtering power source 160 is electrically connected to the target 130 via wiring 161. The sputtering power source 160 can generate a direct current voltage (DC voltage) or an alternating current voltage (AC voltage) and apply the generated voltage to the target 130. The frequency of the AC voltage is 13.56 MHz. The sputtering power source 160 can also apply a bias voltage to the target 130 and further apply a DC voltage or an AC voltage.

The sputtering power source 160 may periodically change a voltage applied to the target 130. For example, a voltage is applied to the target 130 for a period of 50 μsec to 10 msec, and then the application of the voltage to the target 130 may be stopped for a period of 2 μsec to 10 msec. In the film formation apparatus 10 according to the present embodiment, a period in which a voltage is applied to the target 130 and a period in which the application of the voltage to the target 130 is stopped are repeated to form a gallium nitride film. In the following description, a state in which a voltage is applied to the target 130 may be referred to as an "on-state of the sputtering power source 160", and a state in which a voltage is not applied to the target 130 may be referred to as an "off-state of the sputtering power source 160."

The sputtering gas supply unit 170 is connected to the vacuum chamber 100 through a pipe 171. The sputtering gas supply unit 170 can supply a sputtering gas into the vacuum chamber 100 through the pipe 171. Further, the flow rate of the sputtering gas can be controlled by a mass flow controller 172 connected to the pipe 171. Argon (Ar) or krypton (Kr) can be used as the sputtering gas supplied from the sputtering gas supply unit 170.

The first radical supply source 180 is connected to a pipe 181 provided in the vacuum chamber 100, and can supply nitrogen radicals and hydrogen radicals into the vacuum chamber 100. The pipe 181 may be provided with one end facing the substrate support part 110. In this case, the nitrogen radicals and the hydrogen radicals can be irradiated from one end of the pipe 181 toward a substrate placed on the substrate support portion 110. Although details are described later, the first radical supply source 180 can generate the nitrogen radicals by turning a first gas containing nitrogen into a plasma.

The second radical supply source 190 is connected to a pipe 191 provided in the vacuum chamber 100, and can supply chlorine radicals into the vacuum chamber 100. The pipe 191 may be provided such that one end of the pipe 191 faces the substrate support portion 110. In this case, the chlorine radicals can be irradiated from one end of the pipe 191 toward the substrate placed on the substrate support portion 110. Although details are described later, the second radical supply source 190 can generate the chlorine radicals by turning a second gas containing chlorine into a plasma.

In addition, the first radical source 180 may be provided in the vacuum chamber 100 and generate the nitrogen radicals in the vacuum chamber 100. Similarly, the second radical source 190 may be provided in the vacuum chamber 100 and generate the chlorine radicals in the vacuum chamber 100.

The control unit 200 can control the operation of the film formation apparatus 10 in forming the gallium nitride film. The control unit 200 is a computer that can perform arithmetic processing using data or information, and includes, for example, a central processing unit (CPU), a microprocessor (MPU), or a random access memory (RAM). Specifically, the control unit 200 executes a predetermined program to control the operation of the film formation apparatus 10. Here, the details of the control of the control unit 200 are described with reference to FIG. 2.

Figure 2:
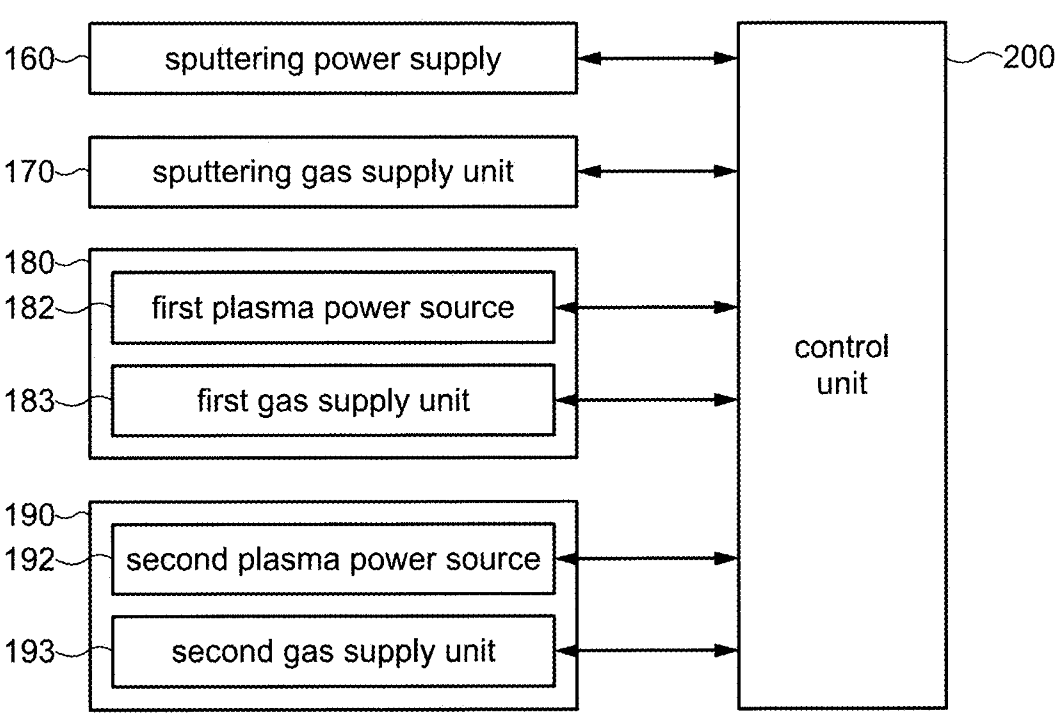
FIG. 2 is a block diagram showing connections of a control unit of a film forming apparatus according to an embodiment of the present invention.

FIG. 2 is a block diagram showing connections in the control unit 200 of the film formation apparatus 10 according to an embodiment of the present invention.

As shown in FIG. 2, the control unit 200 is connected to the sputtering power source 160 and the sputtering gas supply unit 170. Therefore, the control unit 200 can control the on- or off-state of the sputtering power source 160 and the start or stop of the supply of the sputtering gas to the vacuum chamber 100. In addition, although FIG. 2 shows a configuration in which the control unit 200 is connected to the sputtering gas supply unit 170, the control unit 200 may be connected to the mass flow controller 172 to control the start or stop of the supply of the sputtering gas by the mass flow controller 172.

Further, the control unit 200 is connected to a first plasma power source 182 and a first gas supply unit 183 included in the first radical supply source 180. Therefore, the control unit 200 can control the on- or off-state of the first plasma power source 182 and the start or stop of the supply of the first gas. The first plasma power source 182 turns the first gas supplied from the first gas supply unit 183 into a plasma. Therefore, when the control unit 200 starts the supply of the first gas and controls the first plasma power source 182 to be in the on-state, the radicals of the first gas are supplied from the first radical supply source 180 to the vacuum chamber 100. The first gas is a gas containing nitrogen and hydrogen, such as a nitrogen/hydrogen mixed gas ($N_2/H_2$ mixed gas) or ammonia gas ($NH_3$ gas). Therefore, nitrogen radicals and hydrogen radicals are supplied from the first radical supply source 180 to the vacuum chamber 100 as the radicals of the first gas. In addition, when the control unit 200 starts the supply of the first gas and controls the first plasma power source 182 to be in the off-state, the first gas may be supplied from the first radical supply source 180 to the vacuum chamber 100.

The first gas may be a gas in which nitrogen gas ($N_2$ gas) and hydrogen gas ($H_2$ gas) are supplied separately, instead of the $N_2/H_2$ mixed gas. In this case, the control unit 200 can control the start or stop of the supply of $N_2$ gas and $H_2$ gas separately and independently.

Further, the control unit 200 is connected to the second plasma power source 192 and the second gas supply unit 193 included in the second radical supply source 190. Therefore, the control unit 200 can control the on- or off-state of the second plasma power source 192 and the start or stop of the supply of the second gas. The second plasma power source 192 turns the second gas supplied from the second gas supply unit 193 into plasma. Therefore, when the control unit 200 starts the supply of the second gas and controls the second plasma power source 192 to be in the on-state, the radicals of the second gas are supplied from the second radical supply source 190 to the vacuum chamber 100. The second gas is a gas containing chlorine, such as chlorine gas ($Cl_2$ gas) or boron trichloride gas ($BCl_3$ gas). Therefore, chlorine radicals are supplied from the second radical supply source 190 to the vacuum chamber 100 as the radicals of the second radicals. In addition, when the control unit 200 starts the supply of the second gas and controls the second plasma power source 192 to be in an off-state, the second gas may be supplied from the second radical supply source 190 to the vacuum chamber 100.

As described above, the control unit 200 can control the first plasma power source 182 and the first gas supply unit 183, that is, control the start or stop of the supply of the first radicals from the first radical supply source 180. Therefore, hereinafter, for convenience, the control unit 200 may be described as controlling the first radical supply source 180. Similarly, the control unit 200 may be described as controlling the second radical supply source 190.

The control unit 200 may control the pump 150 so that a predetermined pressure is maintained in the vacuum chamber 100. Further, the control unit 200 may control the heating unit 120 so that the substrate placed on the substrate support portion 110 is heated at a predetermined temperature.

Although details are described later, it is possible to form a high-quality gallium nitride film on a substrate even at a low substrate temperature of 400° C. to 600° C. in the film formation apparatus 10 according to an embodiment of the present invention by repeatedly performing a gallium nitride film formation process, an etching process, and an impurity reduction process using the nitrogen radicals, the hydrogen radicals, and the chlorine radicals.

In addition, the film formation apparatus 10 can also form nitride films other than a gallium nitride film by using materials other than gallium nitride for the target 130.

[2. Film Formation Method of Gallium Nitride Film Using Film Formation Apparatus 10]

In the film formation apparatus 10, a gallium nitride film can be formed using various film formation methods depending on the difference in control by the control unit 200. Hereinafter, several examples of control methods for forming a gallium nitride film are described. However, formation of a gallium nitride film using the film formation apparatus 10 is not limited to the following control methods.

[2-1. Control Method 1]

Figure 3:
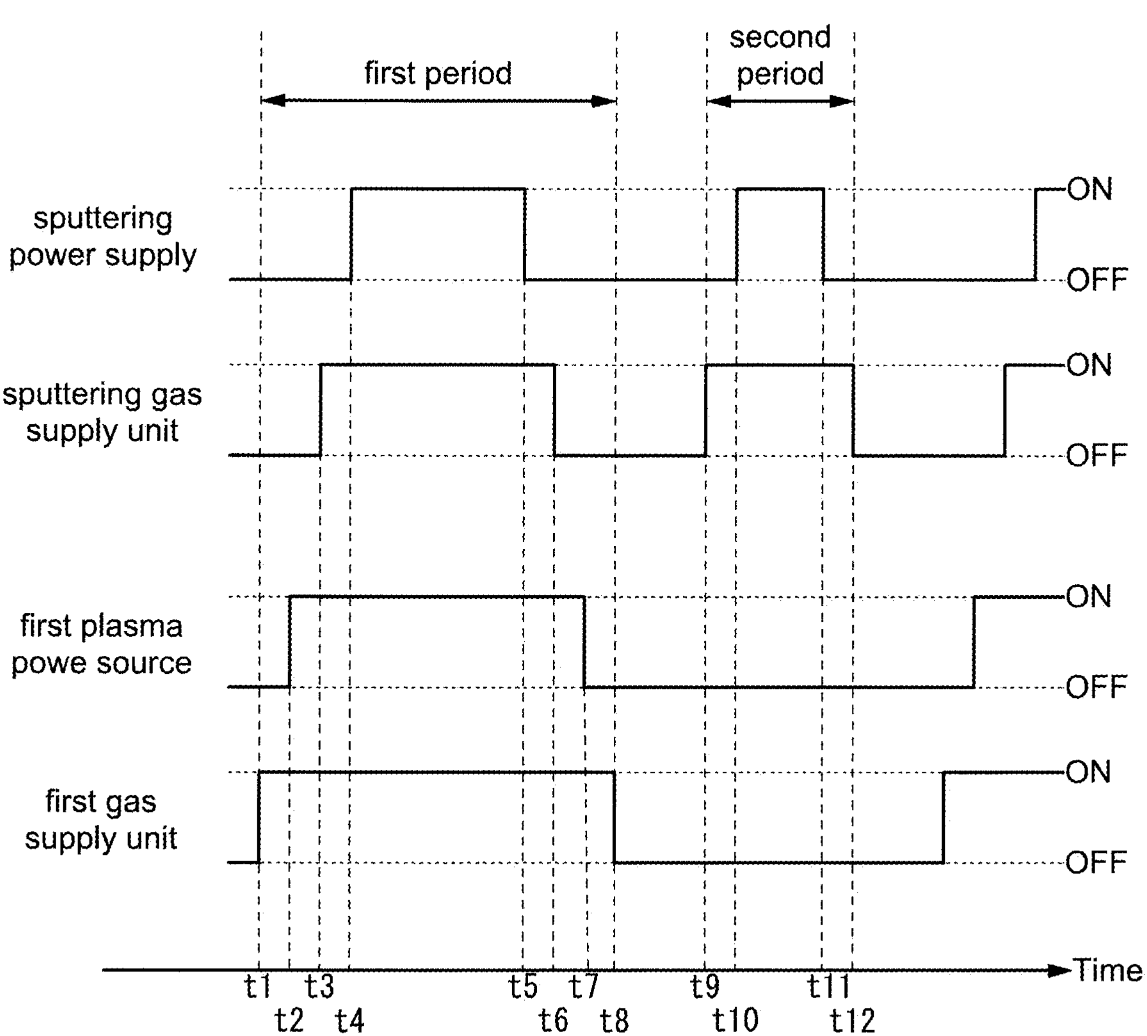
FIG. 3 is a sequence diagram showing a control method for forming a gallium nitride film using a film forming apparatus according to an embodiment of the present invention.

FIG. 3 is a sequence diagram showing a control method for forming a gallium nitride film using the film formation apparatus 10 according to an embodiment of the present invention.

The control method shown in FIG. 3 includes a first period from time t1 to time t8 and a second period from time t9 to time t12. In the film formation apparatus 10, the first period and the second period are repeated to form a gallium nitride film on the substrate placed on the substrate support 110.

The supply of the $N_2/H_2$ mixed gas is started from the first gas supply unit 183 at time t1. The first plasma power source 182 is turned into an on-state at time t2, and the nitrogen radicals and the hydrogen radicals are generated from the supplied $N_2/H_2$ mixed gas. The generated nitrogen radicals and hydrogen radicals are supplied to the vacuum chamber 100.

The sputtering gas supply unit 170 starts supplying the Ar gas to the vacuum chamber 100 at time t3. The flow rate of the Ar gas is adjusted by the mass flow controller 172 so that the pressure in the vacuum chamber 100 maintains a predetermined pressure. For example, the predetermined pressure is greater than or equal to 0.1 Pa and less than or equal to 10 Pa. The sputtering power source 160 is turned into an on-state at time t4, and sputtering is started. Specifically, the Ar gas supplied to the vacuum chamber 100 is turned into plasma, and argon cations ($Ar^+$) and electrons ($e^-$) are generated. The argon cations are accelerated by the potential difference between the substrate and the target 130 and collide with the target 130. As a result, gallium and gallium cations are sputtered from the target 130.

The sputtering power source 160 is turned into an off-state at time t5, and sputtering is stopped. The supply of the Ar gas from the sputtering gas supply unit 170 to the vacuum chamber 100 is stopped at time t6.

The first plasma power source 182 is turned into an off-state at time t7, and the supply of the nitrogen radicals and the hydrogen radicals to the vacuum chamber 100 is stopped. The supply of the $N_2/H_2$ mixed gas from the first gas supply unit 183 is stopped at time t8.

The sputtering gas supply unit 170 starts supplying the Ar gas to the vacuum chamber 100 at time t9. The sputtering power source 160 is turned into an on-state at time t10, and sputtering is started.

The sputtering power source 160 is turned into an off-state at time t11, and sputtering is stopped. The supply of the Ar gas from the sputtering gas supply unit 170 to the vacuum chamber 100 is stopped at time t12.

Gallium nitride has two crystal axes of a gallium plane having Ga polarity (hereinafter, referred to as "Ga plane") and a nitrogen plane having N polarity (hereinafter, referred to as "N plane"). Although the Ga plane is chemically stable, it is thermally unstable. On the other hand, although the N plane is thermally stable, it is chemically unstable. In the control method shown in FIG. 3, the surface of the gallium nitride film can be controlled to the Ga plane or the N plane.

During a period from time t4 to time t5 in the first period, not only the gallium and the gallium cations generated by sputtering but also the nitrogen radicals supplied from the first radical supply source 180 are present in the vacuum chamber 100. Therefore, the gallium reacts in recombination with the nitrogen radical to generate gallium nitride. The generated gallium nitride is deposited on the substrate to form a gallium nitride film.

Further, during the period from time t4 to time t5 in the first period, gallium nitride is also generated by another recombination reaction. Nitrogen has a high electronegativity and easily attracts an electron. Therefore, the nitrogen radical reacts with an electron in the vacuum chamber 100 to generate a nitrogen anion. The generated nitrogen anion reacts in recombination with the gallium cation present in the vicinity of the substrate to generate gallium nitride. The generated gallium nitride is deposited on the substrate to form a gallium nitride film. Since the recombination reaction of the cation and the anion is a reaction that releases a large amount of energy, the gallium nitride film can be formed on the substrate even when the substrate temperature is low.

Furthermore, during a period from time t5 to time t8 in the first period, gallium nitride is generated by the other recombination reaction. Specifically, during the period from time t5 to time t8 in the first period, gallium nitride can be generated using an Ar gas in a metastable state. Here, the generation of the gallium nitride using the metastable Ar gas is described.

It is known that a rare gas atom in a metastable state with a long lifetime exists in the plasma of the rare gas. For example, metastable energies of an argon atom and a krypton atom are 11.61 eV and 9.91 eV, respectively. Such metastable argon or krypton atoms are generated in the plasma of sputtering, and can exist even after the plasma disappears due to their long lifetime. That is, the metastable argon atom can exist even after the application of the voltage to the target 130 is stopped.

After the application of the voltage to the target 130 is stopped, not only the nitrogen radicals but also nitrogen molecules are present in the vacuum chamber 100. The dissociation energy from the nitrogen molecule to the nitrogen atom due to the collision of electrons is 9.756 eV, which is close to the metastable energy of the argon atom. Therefore, when the nitrogen molecule collides with the metastable argon atom, a dissociation reaction of the nitrogen molecule occurs to generate a nitrogen radical. That is, even after the application of the voltage to the target 130 is stopped, the nitrogen radicals are generated by the metastable argon atom. As described above, since the electronegativity of nitrogen is large, the nitrogen radical reacts with an electron in the vacuum chamber 100 to generate a nitrogen anion. Further, during a period from time t6 to time t7, the nitrogen radicals are supplied from the first radical supply source 180 to the vacuum chamber 100. The supplied nitrogen radical reacts with the electron in the vacuum chamber 100 to generate a nitrogen anion. Thereafter, the nitrogen anion recombines with the gallium cation present close to the substrate to generate gallium nitride, which is deposited on the substrate to form a gallium nitride film.

As described above, since the gallium nitride film is formed even when the sputtering power source is in the off-state in the first period, the film formation speed of the gallium nitride film is improved in the film formation apparatus 10. Further, all of the recombination reactions described above are performed in a sufficient nitrogen atmosphere. Therefore, the N plane is formed on the surface of the gallium nitride film formed in the first period.

However, oxygen may remain in the vacuum chamber 100. In this case, gallium cations react with the residual oxygen in the vacuum chamber 100 to generate gallium oxide. When the gallium oxide is generated, the growth of the gallium nitride film is inhibited. Therefore, it is preferable that the residual oxygen in the vacuum chamber 100 is reduced as much as possible. In the first period, the hydrogen radicals are supplied to the vacuum chamber 100. The hydrogen radicals react with the residual oxygen to generate water (water vapor). The generated water vapor is exhausted from the vacuum chamber 100 by the pump 150. That is, since the residual oxygen in the vacuum chamber 100 is reduced in the film formation apparatus 10, the generation of gallium oxide is suppressed, so that the gallium nitride film formed on the substrate is a high-quality film.

As described above, the hydrogen radicals have the effect of removing residual oxygen that inhibits the generation of gallium nitride. Further, the hydrogen radical may react with the gallium cation to generate a gallium hydride cation. The gallium hydride cation is highly reactive and easily reacts with the nitrogen anion to generate gallium nitride. Therefore, the hydrogen radicals also have the effect of promoting the generation of gallium nitride.

During a period from time t10 to time t11 in the second period, the gallium and the gallium positive ions generated by sputtering, and the nitrogen and the nitrogen negative ions released from the target 130 are present in the vacuum chamber 100. Therefore, the gallium and the gallium positive ion react in recombination with the nitrogen and the nitrogen negative ion to generate gallium nitride. The generated gallium nitride is deposited on the substrate to form a gallium nitride film.

In the second period, the nitrogen radicals are not supplied to the vacuum chamber 100. Preferably, the composition of the gallium nitride of the target 130 is more gallium than nitrogen. Therefore, the Ga plane is formed on the surface of the gallium nitride film formed in the second period. Even when the supply of the nitrogen radicals is stopped, unnecessary gas may remain in the vacuum chamber 100. In that case, it is preferable that the second period is determined taking into consideration the time required to exhaust the gas in the vacuum chamber 100.

As described above, the surface of the gallium nitride film can be controlled to be the Ga plane or the N plane in the control method shown in FIG. 3, so that a high-quality gallium nitride film can be formed.

[2-2. Control Method 2]

Figure 4:
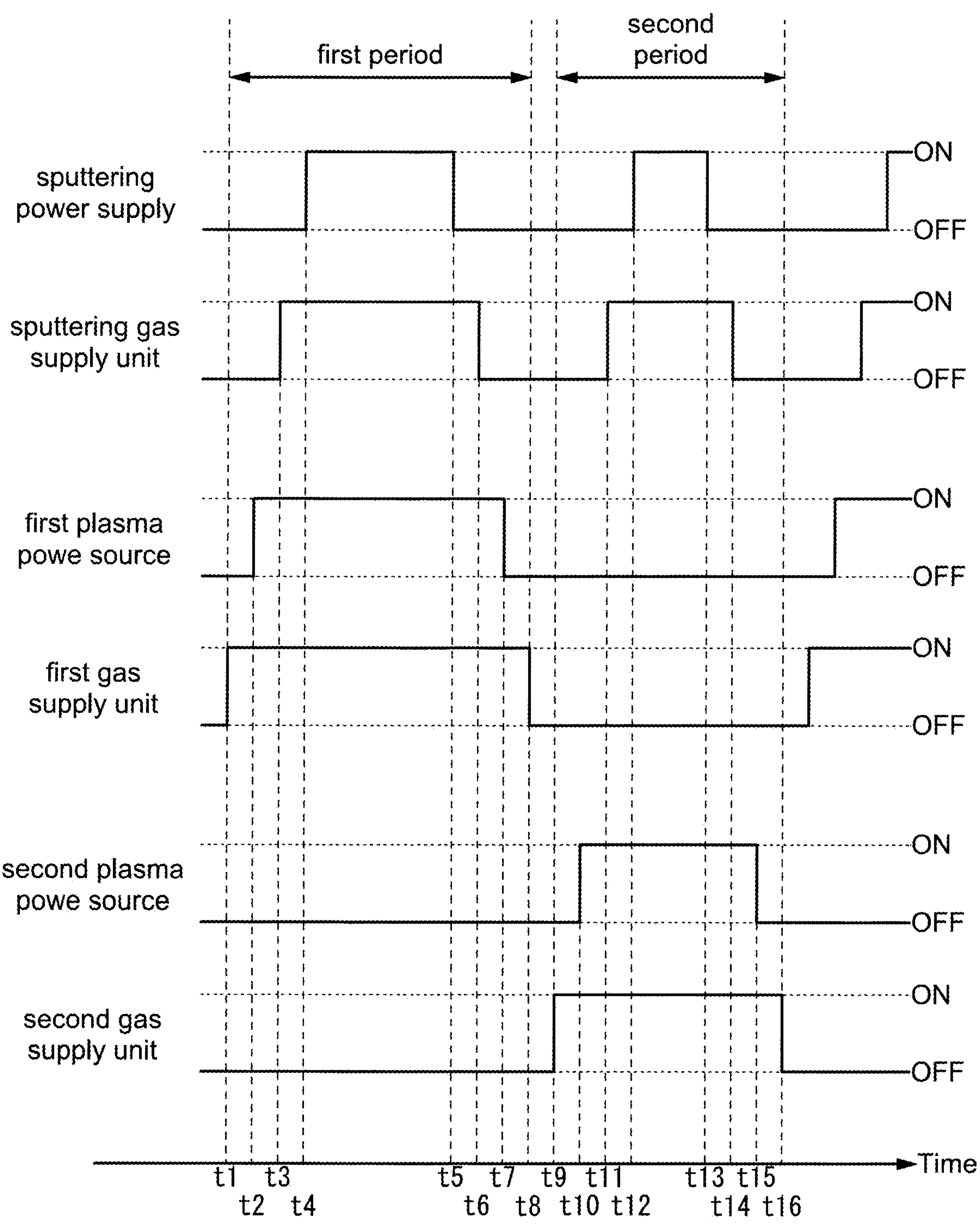
FIG. 4 is a sequence diagram showing a control method for forming a gallium nitride film using a film forming apparatus according to an embodiment of the present invention.

FIG. 4 is a sequence diagram showing a control method for forming a gallium nitride film using the film formation apparatus 10 according to an embodiment of the present invention.

The control method shown in FIG. 3 includes a first period from time t1 to time t8 and a second period from time t9 to time t16. In the film formation apparatus 10, the first period and the second period are repeated to form a gallium nitride film on the substrate placed on the substrate support 110.

Since the first period of the control method 2 is similar to the first period of the above-described control method 1, a description thereof is omitted here.

The supply of the $Cl_2$ gas is started from the second gas supply unit 193 at time t9. The second plasma power source 192 is turned into an on-state at time t10, and the chlorine radicals are generated from the supplied $Cl_2$ gas. The generated chlorine radicals are supplied to the vacuum chamber 100.

The sputtering gas supply unit 170 starts supplying the Ar gas to the vacuum chamber 100 at time t11. The sputtering power source 160 is turned into an on-state at time t12, and sputtering is started.

The sputtering power source 160 is turned into an off-state at time t13, and sputtering is stopped. The supply of the Ar gas from the sputtering gas supply unit 170 to the vacuum chamber 100 is stopped at time t14.

The second plasma power source 192 is turned into an off-state at time t15, and the supply of chlorine radicals to the vacuum chamber 100 is stopped. The supply of the $Cl_2$ gas from the second gas supply unit 193 is stopped at time t16.

The gallium nitride film formed in the first period includes not only crystalline regions but also amorphous regions. Therefore, the amorphous regions of the gallium nitride film are etched using the chlorine radicals in the second period. This etching can improve the crystallinity of the gallium nitride film formed on the substrate. In addition, the amorphous regions have weaker bonds between gallium and nitrogen than the crystalline regions. Therefore, the amorphous regions can be selectively etched. The boiling point of gallium chloride generated by etching is about 200° C. Since the Gallium chloride is a gas in the vicinity of the substrate heated at a temperature higher than or equal to 400° C., the gallium nitride is not deposited on the substrate.

During a period from time t12 to time t13 in the second period, sputtering is performed and the chlorine radicals supplied to the vacuum chamber 100 are turned into plasma. Chlorine has a high electronegativity and easily attracts an electron. Therefore, the chlorine radical reacts with the electron in the plasma to generate a chlorine anion. Therefore, during the period from time t12 to time t13 in the second period, the amorphous regions of the gallium nitride film can be efficiently etched using not only the chlorine radicals but also the chlorine anions.

Further, the gallium nitride film is formed on the substrate in the second period, and the Ga plane is formed on the surface of the gallium nitride film formed in the second period.

In addition, the chlorine may remain in the vacuum chamber 100 after the second period. However, the hydrogen radical supplied to the vacuum chamber 100 reacts with the chlorine to generate hydrogen chloride in the first period following the second period. Since the generated hydrogen chloride is exhausted from the vacuum chamber 100 by the pump 150, the residual chlorine in the vacuum chamber 100 or in the gallium nitride film is reduced.

As described above, the surface of the gallium nitride film can be controlled to be the Ga plane or the N plane and the amorphous regions can be etched in the control method shown in FIG. 4, so that a high-quality gallium nitride film can be formed.

[2-3. Control Method 3]

Figure 5:
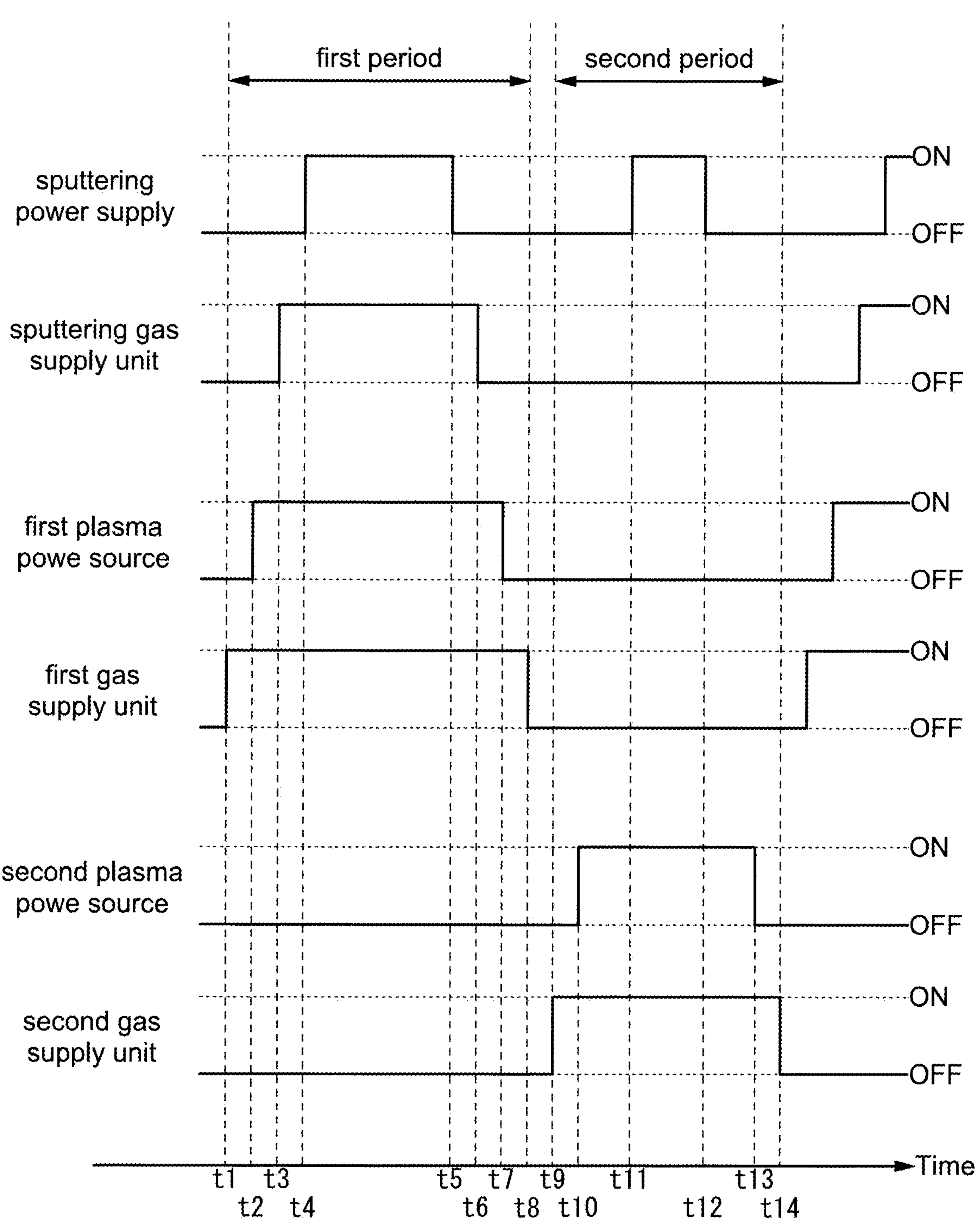
FIG. 5 is a sequence diagram showing a control method for forming a gallium nitride film using a film forming apparatus according to an embodiment of the present invention.

FIG. 5 is a sequence diagram showing a control method for forming a gallium nitride film using the film formation apparatus 10 according to an embodiment of the present invention.

The control method shown in FIG. 5 includes a first period from time t1 to time t8 and a second period from time t9 to time t14. In the film formation apparatus 10, the first period and the second period are repeated to form a gallium nitride film on the substrate placed on the substrate support 110.

Since the first period of the control method 3 is similar to the first period of the above-described control method 1, a description thereof is omitted here.

The supply of the $Cl_2$ gas is started from the second gas supply unit 193 at time t9. The second plasma power source 192 is turned into an on-state at time t10, and the chlorine radicals are generated from the supplied $Cl_2$ gas. The generated chlorine radicals are supplied to the vacuum chamber 100.

The sputtering power source 160 is turned into an on-state at time 11. The sputtering power source 160 is turned into an off-state at time t12.

The second plasma power source 192 is turned into an off-state at time t13, and the supply of the chlorine radicals to the vacuum chamber 100 is stopped. The supply of the $Cl_2$ gas from the second gas supply unit 193 is stopped at time t14.

In the second period, the Ar gas is not supplied and sputtering is not performed. Since the Ar gas is not supplied to the vacuum chamber 100, the number of the chlorine radicals relative to the total number of particles in the vacuum chamber increases. As a result, the etching of the amorphous regions of the gallium nitride film by the chlorine radicals can be promoted. Further, the surface of the gallium nitride film changes from the chemically unstable N plane to the chemically stable Ga plane when the amorphous regions are etched.

As described above, the surface of the gallium nitride film can be controlled to be the Ga plane or the N plane and the amorphous regions can be etched in the control method shown in FIG. 5, so that a high-quality gallium nitride film can be formed.

[2-4. Control Method 4]

Figure 6:
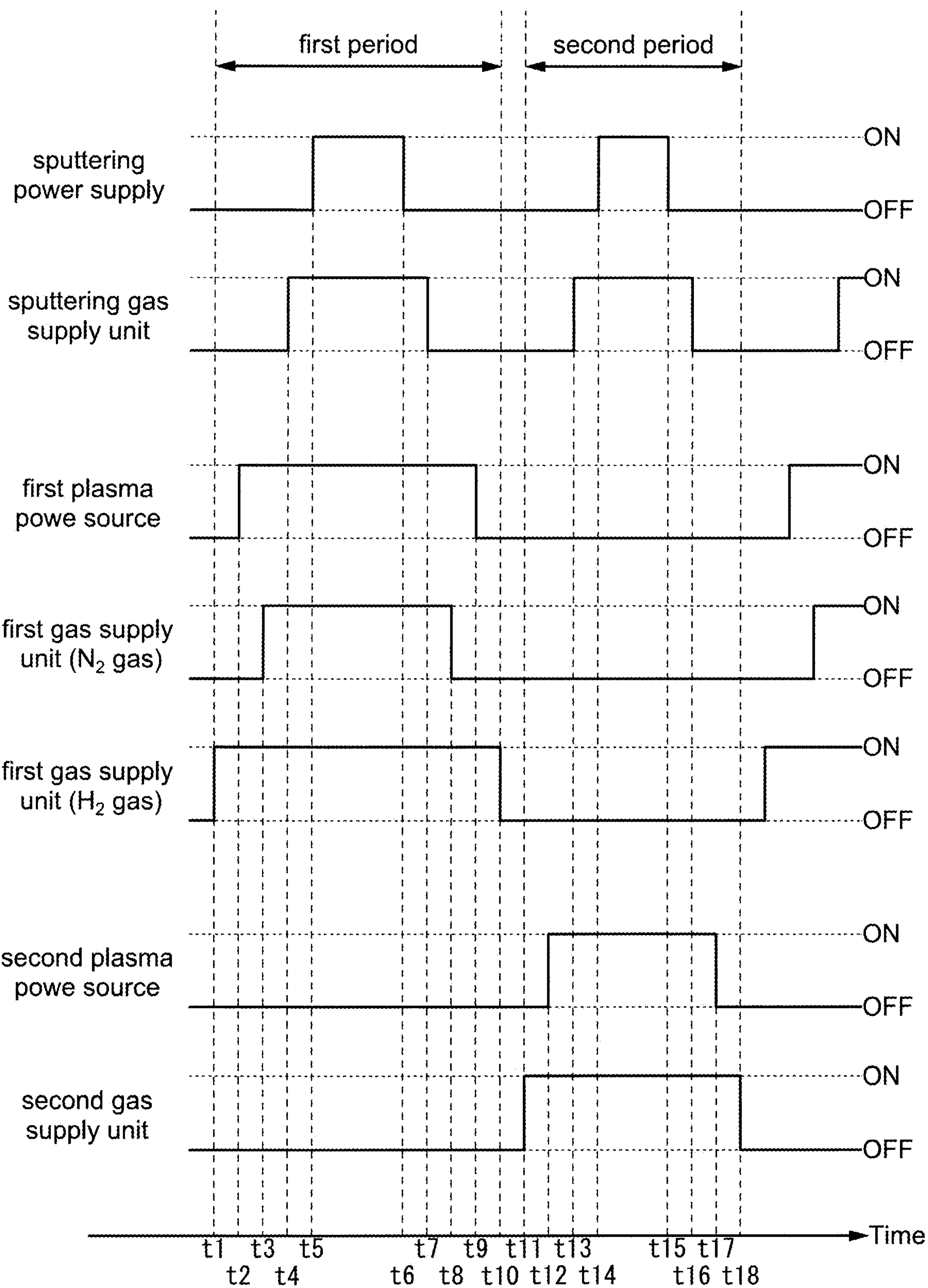
FIG. 6 is a sequence diagram showing a control method for forming a gallium nitride film using a film forming apparatus according to an embodiment of the present invention.

FIG. 6 is a sequence diagram showing a control method for forming a gallium nitride film using the film formation apparatus 10 according to an embodiment of the present invention.

The control method shown in FIG. 6 includes a first period from time t1 to time t10 and a second period from time t11 to time t18. In the film formation apparatus 10, the first period and the second period are repeated to form a gallium nitride film on the substrate placed on the substrate support 110.

The supply of the $H_2$ gas is started from the first gas supply unit 183 at time t1. The first plasma power source 182 is turned into an on-state at time t2, and the hydrogen radicals are generated from the supplied $H_2$ gas. The generated hydrogen radicals are supplied to the vacuum chamber 100. The supply of the $N_2$ gas is started from the first gas supply unit 183 at time t3. At this time, since the first plasma power source is in the on-state, the nitrogen radicals are generated from the supplied $N_2$ gas. The generated nitrogen radicals are supplied to the vacuum chamber 100.

The sputtering gas supply unit 170 starts supplying the Ar gas to the vacuum chamber 100 at time t4. The sputtering power source 160 is turned into an on-state at time t5, and sputtering is started.

The sputtering power source 160 is turned into an off-state at time t6, and sputtering is stopped. The supply of the Ar gas from the sputtering gas supply unit 170 to the vacuum chamber 100 is stopped at time t7.

The supply of the $N_2$ gas is stopped from the first gas supply unit 183 at time t8. Therefore, the generation of the nitrogen radicals in the first radical supply source 180, and the supply of the nitrogen radicals to the vacuum chamber 100 is stopped. The first plasma power source 182 is turned into an off-state at time t9, and the supply of the hydrogen radicals to the vacuum chamber 100 is stopped. The supply of the $H_2$ gas from the first gas supply unit 183 is stopped at time t10.

Since a period from time t11 to time t18 of the control method 4 is similar to a period from time t9 to time t16 of the above-described control method 2, a description thereof is omitted here.

Only the hydrogen radicals are supplied to the vacuum chamber 100 during periods from time t1 to time t2 and from time t8 to time t9 in the first period. In other words, only the hydrogen radicals are supplied to the vacuum chamber 100 before and after the formation of the gallium nitride film in the first period. As described above, the hydrogen radicals have the effect of reducing residual oxygen in the vacuum chamber 100. Further, the hydrogen radicals can also remove gallium oxide formed on the surface of the gallium nitride film immediately before or immediately after the formation of the gallium nitride film.

As described above, the surface of the gallium nitride film can be controlled to be the Ga plane or the N plane and the gallium oxide formed on the surface of the gallium nitride film can be removed in the control method shown in FIG. 6, so that a high-quality gallium nitride film can be formed.

[2-5. Control Method 5]

Figure 7:
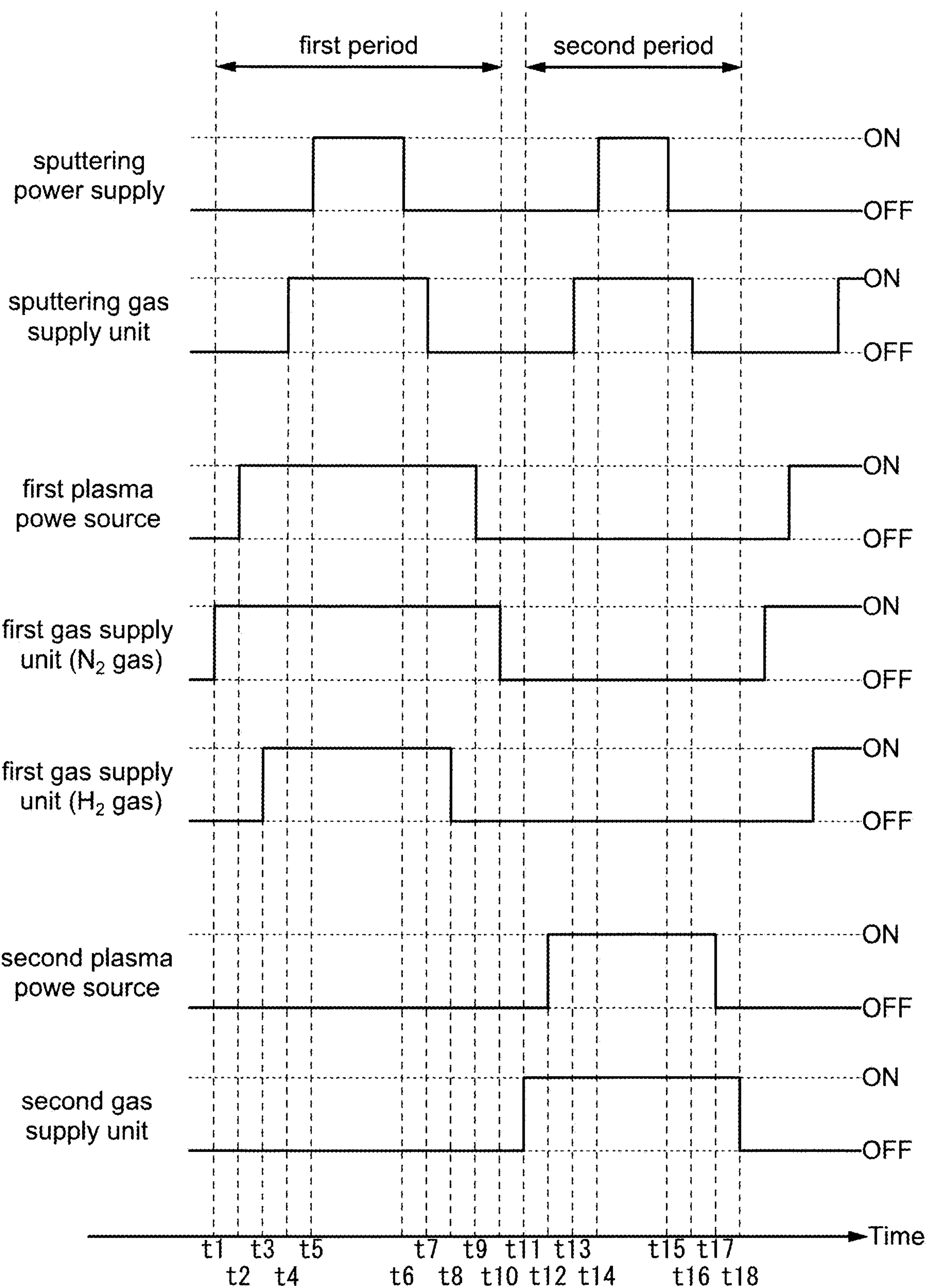
FIG. 7 is a sequence diagram showing a control method for forming a gallium nitride film using a film forming apparatus according to an embodiment of the present invention.

FIG. 7 is a sequence diagram showing a control method for forming a gallium nitride film using the film formation apparatus 10 according to an embodiment of the present invention.

The control method shown in FIG. 7 includes a first period from time t1 to time t10 and a second period from time t11 to time t18. In the film formation apparatus 10, the first period and the second period are repeated to form a gallium nitride film on the substrate placed on the substrate support 110.

The supply of the $N_2$ gas is started from the first gas supply unit 183 at time t1. The first plasma power source 182 is turned into an on-state at time t2, and the nitrogen radicals are generated from the supplied $N_2$ gas. The generated nitrogen radicals are supplied to the vacuum chamber 100. The supply of the $H_2$ gas is started from the first gas supply unit 183 at time t3. At this time, since the first plasma power source is in the on-state, the hydrogen radicals are generated from the supplied $H_2$ gas. The generated hydrogen radicals are supplied to the vacuum chamber 100.

The sputtering gas supply unit 170 starts supplying the Ar gas to the vacuum chamber 100 at time t4. The sputtering power source 160 is turned into an on-state at time t5, and sputtering is started.

The sputtering power source 160 is turned into an off-state at time t6, and sputtering is stopped. The supply of the Ar gas from the sputtering gas supply unit 170 to the vacuum chamber 100 is stopped at time t7.

The supply of the $H_2$ gas is stopped from the first gas supply unit 183 at time t8. Therefore, the generation of the hydrogen radicals in the first radical supply source 180, and the supply of the hydrogen radicals to the vacuum chamber 100 is stopped. The first plasma power source 182 is turned into an off-state at time t9, and the supply of the nitrogen radicals to the vacuum chamber 100 is stopped. The supply of the $N_2$ gas from the first gas supply unit 183 is stopped at time t10.

Since a period from time t11 to time t18 of the control method 5 is similar to a period from time t9 to time t16 of the above-described control method 2, a description thereof is omitted here.

Only the nitrogen radicals are supplied to the vacuum chamber 100 during periods from time t1 to time t2 and from time t8 to time t9 in the first period. In other words, only the nitrogen radicals are supplied to the vacuum chamber 100 before and after the formation of the gallium nitride film in the first period. Therefore, since the nitridation of the surface of the gallium nitride film is promoted, the formation of the N plane of the gallium nitride film can be stabilized.

As described above, the surface of the gallium nitride film can be controlled to be the Ga plane or the N plane, the N plane of the gallium nitride can be stabilized in the control method shown in FIG. 7, and a high-quality gallium nitride film can be formed.

[2-6. Control Method 6]

Figure 8:
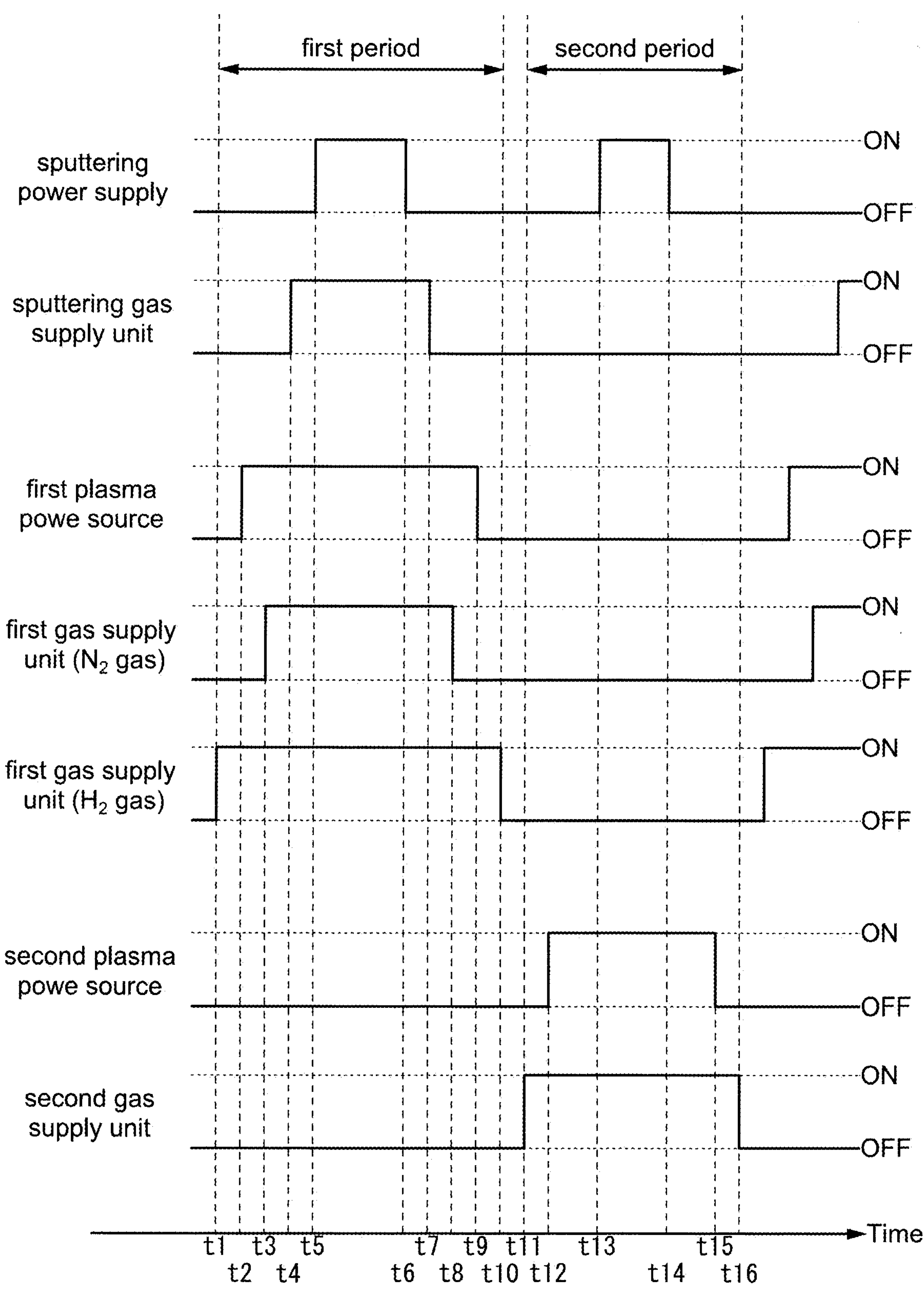
FIG. 8 is a sequence diagram showing a control method for forming a gallium nitride film using a film forming apparatus according to an embodiment of the present invention.

FIG. 8 is a sequence diagram showing a control method for forming a gallium nitride film using the film formation apparatus 10 according to an embodiment of the present invention.

The control method shown in FIG. 8 includes a first period from time t1 to time t10 and a second period from time t11 to time t16. In the film formation apparatus 10, the first period and the second period are repeated to form a gallium nitride film on the substrate placed on the substrate support 110.

Since a period from time t1 to time t10 of the control method 6 is similar to a period from time t1 to time 10 of the above-described control method 4, a description thereof is omitted here.

Since a period from time t11 to time t16 of the control method 6 is similar to a period from time t9 to time 14 of the above-described control method 3, a description thereof is omitted here.

As described above, the surface of the gallium nitride film can be controlled to be the Ga plane or the N plane in the control method shown in FIG. 8. Further, the amorphous regions can be etched and the gallium oxide formed on the surface of the gallium nitride film can be removed in the control method shown in FIG. 8, so that a high-quality gallium nitride film can be formed.

[2-7. Control Method 7]

Figure 9:
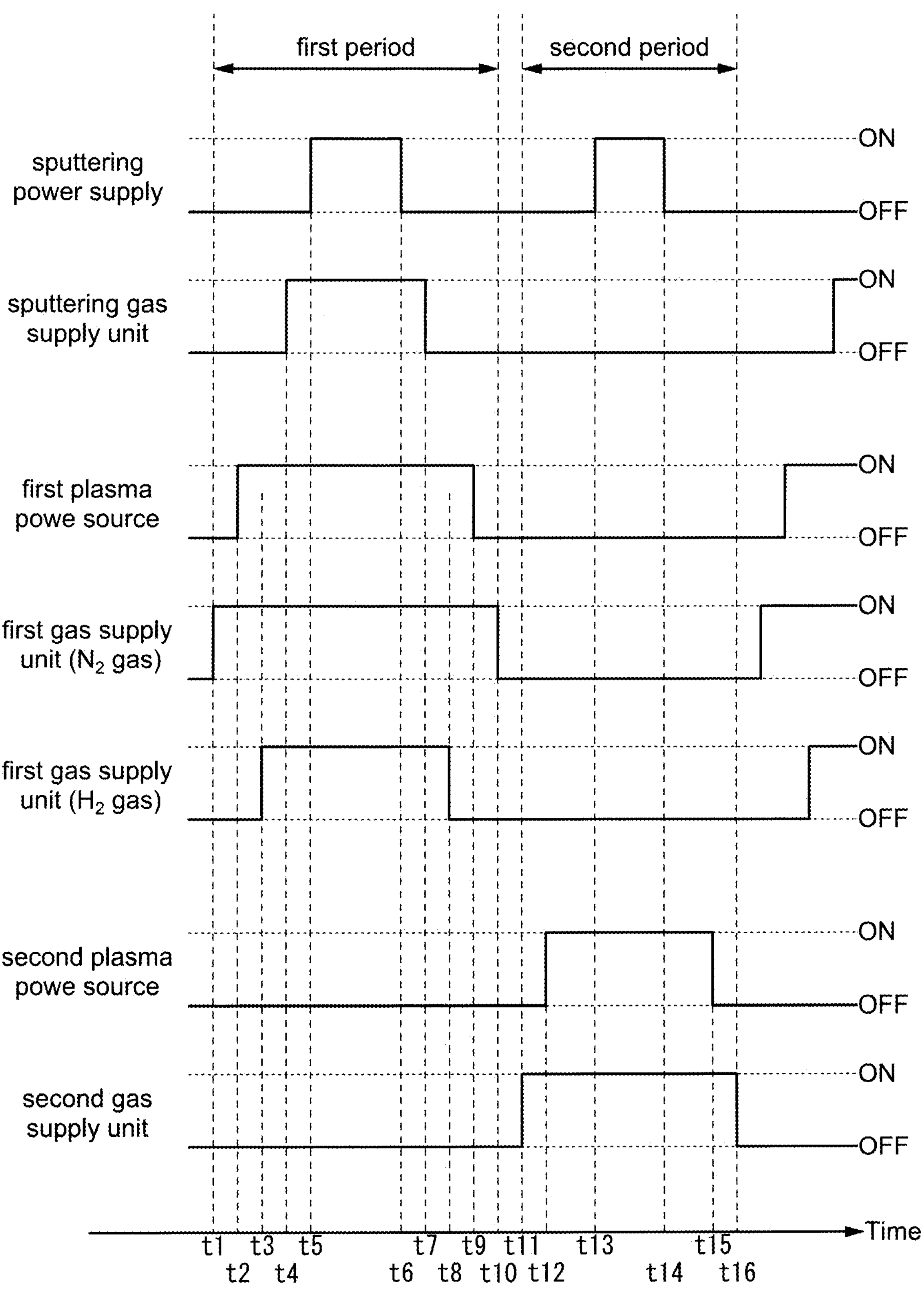
FIG. 9 is a sequence diagram showing a control method for forming a gallium nitride film using a film forming apparatus according to an embodiment of the present invention.

FIG. 9 is a sequence diagram showing a control method for forming a gallium nitride film using the film formation apparatus 10 according to an embodiment of the present invention.

The control method shown in FIG. 9 includes a first period from time t1 to time t10 and a second period from time t11 to time t16. In the film formation apparatus 10, the first period and the second period are repeated to form a gallium nitride film on the substrate placed on the substrate support 110.

Since a period from time t1 to time t10 of the control method 7 is similar to a period from time t1 to time 10 of the above-described control method 5, a description thereof is omitted here.

Since a period from time t11 to time t16 of the control method 7 is similar to a period from time t9 to time 14 of the above-described control method 3, a description thereof is omitted here.

As described above, the surface of the gallium nitride film can be controlled to be the Ga plane or the N plane in the control method shown in FIG. 8. Further, the amorphous regions can be etched and the N plane of the gallium nitride can be stabilized in the control method shown in FIG. 9, so that a high-quality gallium nitride film can be formed.

As described above, in the film formation apparatus 10 according to the present embodiment, a high-quality gallium nitride film can be formed at a low temperature without increasing the temperature of the substrate. Therefore, a high-quality gallium nitride film can be formed on a substrate having low heat resistance, such as a glass substrate, using the film formation apparatus 10.

Second Embodiment

A substrate support portion 110A of the gallium nitride film formation apparatus 10 according to an embodiment of the present invention is described with reference to FIGS. 10 and 11. In addition, the description of the same configuration as that described in the First Embodiment may be omitted in the following description.

Figure 10:
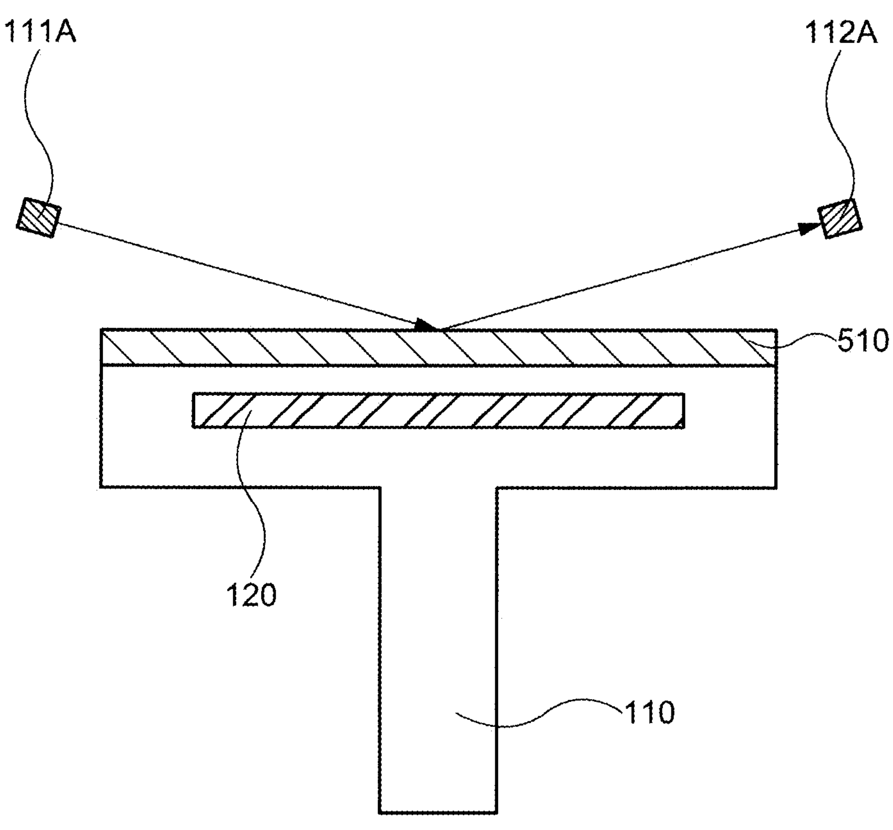
FIG. 10 is a schematic diagram showing a substrate support portion of a film forming apparatus according to an embodiment of the present invention.

FIG. 10 is a schematic diagram showing the substrate support 110A of the film formation apparatus 10 according to an embodiment of the present invention.

As shown in FIG. 10, the film formation apparatus 10 is provided with a light irradiation unit 111A that irradiates light onto a substrate 510 placed on a substrate support portion 110A, and a light receiving unit 112A that receives light reflected from the substrate 510. The installation positions of the light irradiation unit 111A and the light receiving unit 112A in the film formation apparatus 10 are not limited to a specific position. The light irradiated by the light irradiation unit 111A is infrared light or visible light.

Figure 11:
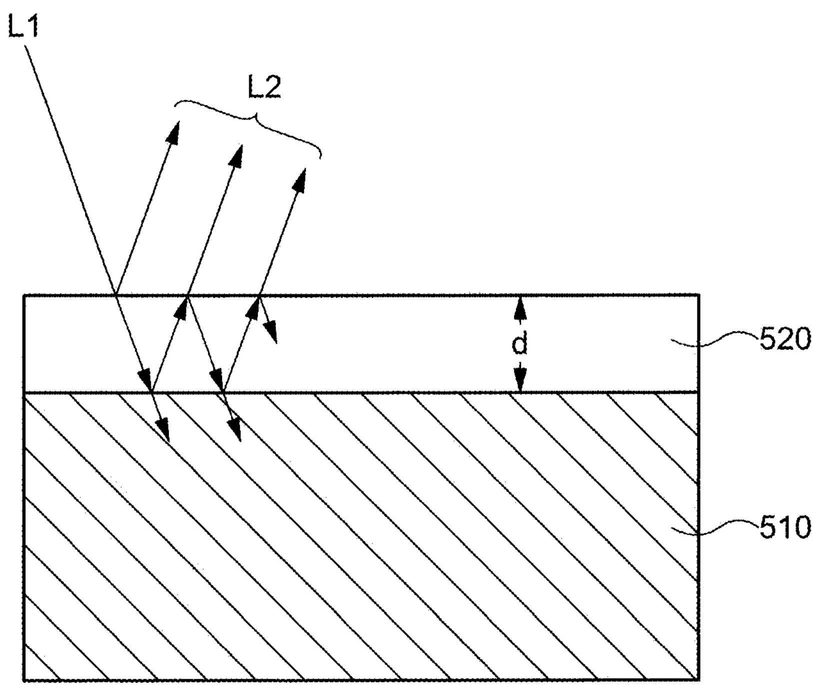
FIG. 11 is a schematic diagram illustrating a measurement of a thickness of a gallium nitride film in a film formation apparatus according to an embodiment of the present invention.

FIG. 11 is a schematic diagram illustrating a measurement of a thickness of a gallium nitride film in the film formation apparatus 10 according to an embodiment of the present invention.

As described in the Second Embodiment, there is an off-period of the sputtering power source 160 in the formation of a gallium nitride film using the film formation apparatus 10. In the off-period, no plasma is generated in the vacuum chamber 100. Therefore, when the light L1 is irradiated from the light irradiation unit 111A, the light receiving unit 112A can receive the light reflected from the substrate 510 and the gallium nitride film 520 formed on the substrate 510.

The substrate 510, the gallium nitride film 520, and the atmosphere in the vacuum chamber 100 have different refractive indices. Therefore, the light L1 irradiated from the light irradiation unit 111A not only passes through the substrate 510 and the gallium nitride film 520, but is also reflected at the interface between the substrate 510 or the buffer layer formed on the substrate 510 and the gallium nitride film 520, or at the surface of the gallium nitride film 520. That is, the light receiving unit 112A receives the light L2 that has been reflected multiple times. As the flat gallium nitride film 520 grows, the reflected light from the substrate 510 and the gallium nitride film 520 interferes with each other, so that periodic vibrations occur. That is, vibrations in reflectance of the light received by the light receiving unit 112A occur, and is detected as a periodic pattern. Specifically, when the wavelength of the light L1 is λ, the optical path difference 2nd of the light L2 is expressed by the formula $2nd=k\lambda$ (k is a natural number). Here, n is the refractive index of the gallium nitride film 520, and d is the thickness of the gallium nitride film 520. Therefore, the thickness d of the gallium nitride film 520 can be calculated based on the periodic pattern and the above formula.

In the film formation apparatus 10 according to an embodiment of the present invention, the film thickness of the gallium nitride film can be measured using the interference phenomenon when light is irradiated while the sputtering power source 160 is in the off-state. Therefore, in the film formation apparatus 10, the film thickness of the gallium nitride film to be formed can be controlled.

Third Embodiment

A light emitting element 1000 according to an embodiment of the present invention is described with reference to FIGS. 12 and 13.

[1. Configuration of Light Emitting Element 1000]

Figure 12:
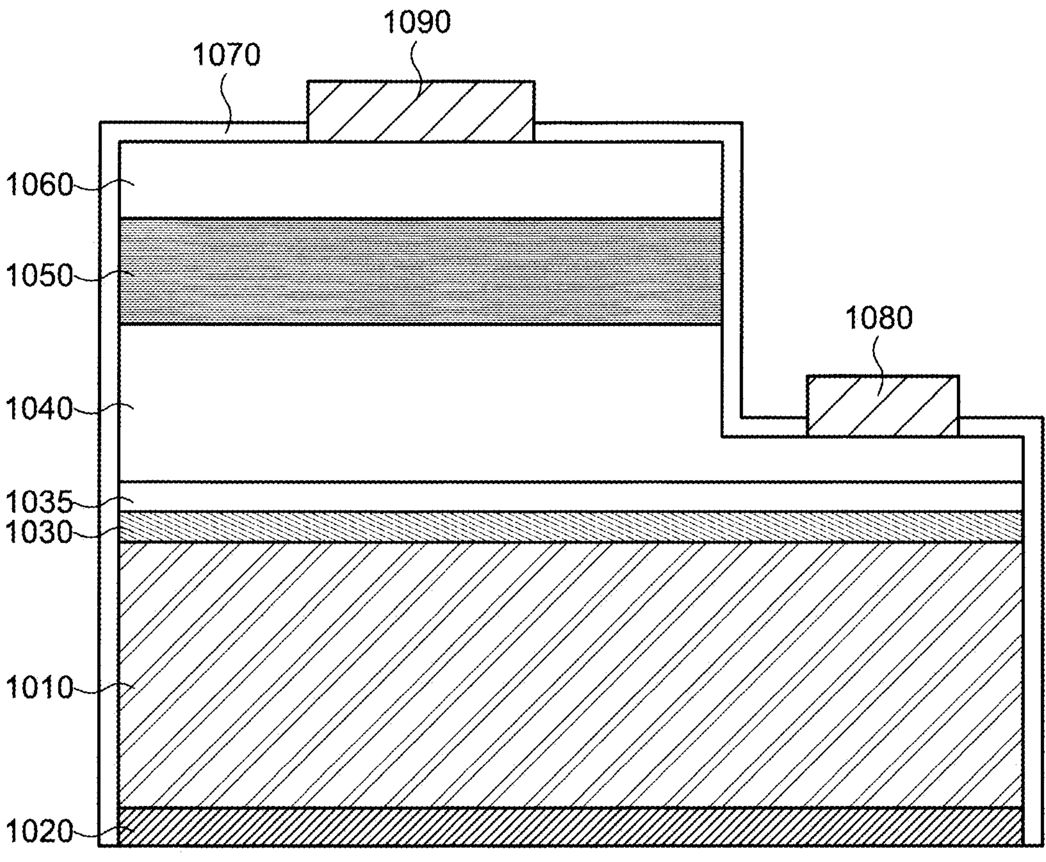
FIG. 12 is a schematic diagram showing a configuration of a light emitting element according to an embodiment of the present invention.

FIG. 12 is a schematic diagram showing a configuration of the light emitting element 1000 according to an embodiment of the present invention.

As shown in FIG. 12, the light emitting element 1000 includes a substrate 1010, a compensation layer 1020, a buffer layer 1030, an undoped semiconductor layer 1035, an n-type semiconductor layer 1040, a light emitting layer 1050, a p-type semiconductor layer 1060, a protective layer 1070, an n-type electrode 1080, and a p-type electrode 1090. Although the light emitting element 1000 is a so-called LED (Light Emitting Diode), the light emitting element 1000 is not limited thereto.

For example, a glass substrate or a quartz substrate can be used as the substrate 1010. Since the gallium nitride film can be formed at a low temperature using the film formation apparatus 10, it is preferable to use a glass substrate that can be made large in area as the substrate 1010. The glass substrate is an amorphous substrate containing a glass material that does not generally have a crystalline structure but has a crystalline structure in a fine region. The upper limit of the thermal expansion coefficient of the glass substrate is less than $4.2\times10^{-6}$/K, and preferably less than $4.0\times10^{-6}$/K. The lower limit of the thermal expansion coefficient of the glass substrate is greater than $3.0\times10^{-6}$/K, and preferably greater than $3.5\times10^{-6}$/K. The glass substrate requires resistance to the thermal history during the manufacture of a semiconductor device. Therefore, the lower limit of the glass transition point of the glass substrate is, for example, greater than or less than 650° C., and preferably greater than or equal to 720° C. Further, the upper limit of the glass transition point of the glass substrate is, for example, less than or equal to 900° C., and preferably less than or equal to 810° C. For the same reason, the lower limit of the softening point of the glass substrate is, for example, greater than or equal to 900° C., and preferably greater than or equal to 950° C. The upper limit of the softening point of the glass substrate is, for example, less than or equal to 1150° C., and preferably less than or equal to 1050° C.

A glass material with a low content of alkali metal components can be used for the glass substrate in order to prevent the alkali metal components in the glass material from contaminating the light emitting layer 1050. For example, the content of the alkali metals in the glass substrate is less than or equal to 0.1% by mass.

For example, an amorphous glass material containing aluminoborosilicate glass or aluminosilicate glass is used for such an amorphous glass substrate. Such an amorphous glass material is used in a liquid crystal display or an organic electroluminescent (organic EL) display, and a large-area glass substrate called a mother glass is provided on the market. When a glass substrate is selected as the substrate of the light emitting element 1000, the light emitting element 1000 can be manufactured at low cost using a large-area substrate.

The substrate 1010 has a first surface on which the light emitting layer 1050 is formed, and a second surface on which the compensation layer 1020 is formed. The surface roughness of the first surface and the second surface of the substrate 1010 do not need to be the same. However, from the viewpoint of preventing electrostatic damage due to peeling charging when the light emitting element 1000 is removed from various apparatuses during the manufacturing process of the light emitting element 1000, the surface roughness of the second surface can be made rougher than the surface roughness of the first surface.

Although the thickness of the substrate 1010 is not particularly limited to a specific thickness, a substrate that is sufficiently thicker than the total thickness of the n-type semiconductor layer 1040, the light emitting layer 1050, and the p-type semiconductor layer 1060 can be used from the viewpoint of reducing warpage of the substrate 1010. For example, the substrate 1010 has a film thickness greater than or equal to 50 times the total film thickness of the n-type semiconductor layer 1040, the light emitting layer 1050, and the p-type semiconductor layer 1060. The substrate 1010 has a thickness of, for example, 0.5 to 1.0 mm.

Although the mechanical strength of the substrate 1010 is not particularly limited to a specific value, it is preferable that the substrate 1010 has a Young's modulus of, for example, 70 to 90 GPa from the viewpoint of reducing warpage of the substrate 1010.

The compensation layer 1020 is formed on the second surface of the substrate 1010. When the compensation layer 1020 is provided on the second surface, warpage of the substrate 1010, which is disadvantageous when the light emitting element 1000 is manufactured, can be reduced. Further, when the compensation layer 1020 is provided on the second surface, degassing such as $H_2O$ from the second surface side of the substrate 1010 can be reduced during decompression and heating for forming the n-type semiconductor layer 1040, the light emitting layer 1050, and the p-type semiconductor layer 1060, and the intrusion of oxygen into the n-type semiconductor layer 1040, the light emitting layer 1050, and the p-type semiconductor layer 1060 can be reduced. Furthermore, by appropriately selecting the material of the compensation layer 1020, the resistance to the chemical treatment with acid used in the manufacturing process of the light emitting element 1000 is also improved.

The compensation layer 1020 can reduce warpage of the substrate 1010 caused by the difference in thermal expansion coefficient between the substrate 1010 and the n-type semiconductor layer 1040, the light emitting layer 1050, or the p-type semiconductor layer 1060 by setting the thermal expansion coefficient within a predetermined range. The thermal expansion coefficient of the compensation layer 1020 is greater than that of the substrate 1010 and is less than that of the substrate 1010 and the n-type semiconductor layer 1040, the light emitting layer 1050, and the p-type semiconductor layer 1060. The lower limit of the thermal expansion coefficient of the compensation layer 1020 is, for example, greater than $4.0\times10^{-6}$/K, and preferably greater than $4.1\times10^{-6}$/K. The upper limit of the thermal expansion coefficient of the compensation layer 1020 is, for example, less than $5.0\times10^{-6}$/K, and preferably less than $4.6\times10^{-6}$/K.

Since the compensation layer 1020 is adjacent to the substrate 1010, heat can be efficiently and uniformly transferred to the entire substrate 1010 in the heating process for forming the n-type semiconductor layer 1040, the light emitting layer 1050, and the p-type semiconductor layer 1060 on the substrate 1010 by setting the thermal conductivity to a predetermined value. As a result, the uniformity of the thicknesses of the n-type semiconductor layer 1040, the light emitting layer 1050, and the p-type semiconductor layer 1060 can be improved. Therefore, the compensation layer 1020 can have a thermal conductivity that exceeds the thermal conductivity of the substrate 1010. The thermal conductivity of the compensation layer 1020 can be appropriately set depending on the material of the substrate 1010, and is, for example, greater than 10 $Wm^{-1}K^{-1}$, and preferably greater than 40 $Wm^{-1}K^{-1}$.

The thermal conductivity of the compensation layer 1020 can be adjusted by adjusting the film density to a predetermined value. Although the relationship between the film density and the thermal conductivity varies depending on the material of the compensation layer 1020, the lower limit of the film density of the compensation layer 1020 is, for example, greater than or equal to 2.50 $g/cm^3$, and preferably greater than or equal to 2.60 $g/cm^3$. The upper limit of the film density of the compensation layer 1020 is less than or equal to 4.10 $g/cm^3$, and preferably less than or equal to 4.00 $g/cm^3$.

Although the material used for the compensation layer 1020 is not particularly limited to a certain material as long as it satisfies the above-described physical property values, it is preferable that the material is resistant to chemical treatment with acid or the like used in the manufacturing process of the light emitting element 1000. For example, an aluminum nitride film or an aluminum oxide film, or a stacked film of an aluminum nitride film and an aluminum oxide film can be used as the compensation layer 1020.

The method for forming the compensation layer 1020 is not limited to a certain method and any known film formation method can be used. However, it is preferable to form the compensation layer 1020 using sputtering in order to form the compensation layer 1020 on a large-area substrate and to prevent the temperature of the substrate 1010 from excessively increasing during the formation of the compensation layer 1020. The sputtering conditions are not limited to certain conditions, and a known sputtering apparatus can be used and the conditions can be set appropriately.

The thickness of the compensation layer 1020 is not particularly limited to a certain thickness, and is set appropriately depending on the structure of the light emitting element 1000. However, the compensation layer 1020 can be formed so as not to be excessively thin compared to the total thickness of the n-type semiconductor layer 1040, the light-emitting layer 1050, and the p-type semiconductor layer 1060 from the viewpoint of reducing warpage of the substrate 1010. For example, the compensation layer 1020 can have a thickness greater than or equal to 80% of the total thickness of the n-type semiconductor layer 1040, the light-emitting layer 1050, and the p-type semiconductor layer 1060.

The buffer layer 1030 can control the crystal orientation of the undoped semiconductor layer 1035 and the n-type semiconductor layer 1040, and can improve the crystallinity of the n-type semiconductor layer 1040. For example, an aluminum nitride film or the like can be used as the buffer layer 1030.

The undoped semiconductor layer 1035 can promote epitaxial growth of the n-type semiconductor layer 1040. For example, a gallium nitride film or the like can be used as the undoped semiconductor layer 1035.

A gallium nitride film doped with silicon can be used as the n-type semiconductor layer 1040. A stacked structure in which an indium gallium nitride film and a gallium nitride film are alternately stacked can be used for the light emitting layer 1050. A gallium nitride film doped with magnesium can be used as the p-type semiconductor layer 1060. A silicon oxide film can be used as the protective layer 1070. A metal film such as indium can be used for the n-type electrode 1080. A metal film such as palladium or gold can be used for the p-type electrode 1090. In addition, it is preferable that the oxygen concentration in the light emitting layer 1050 and the p-type semiconductor layer 1060 is less than $1\times10^{18}$ $cm^{-3}$.

[2. Method for Manufacturing Light Emitting Element 1000]

Figure 13:
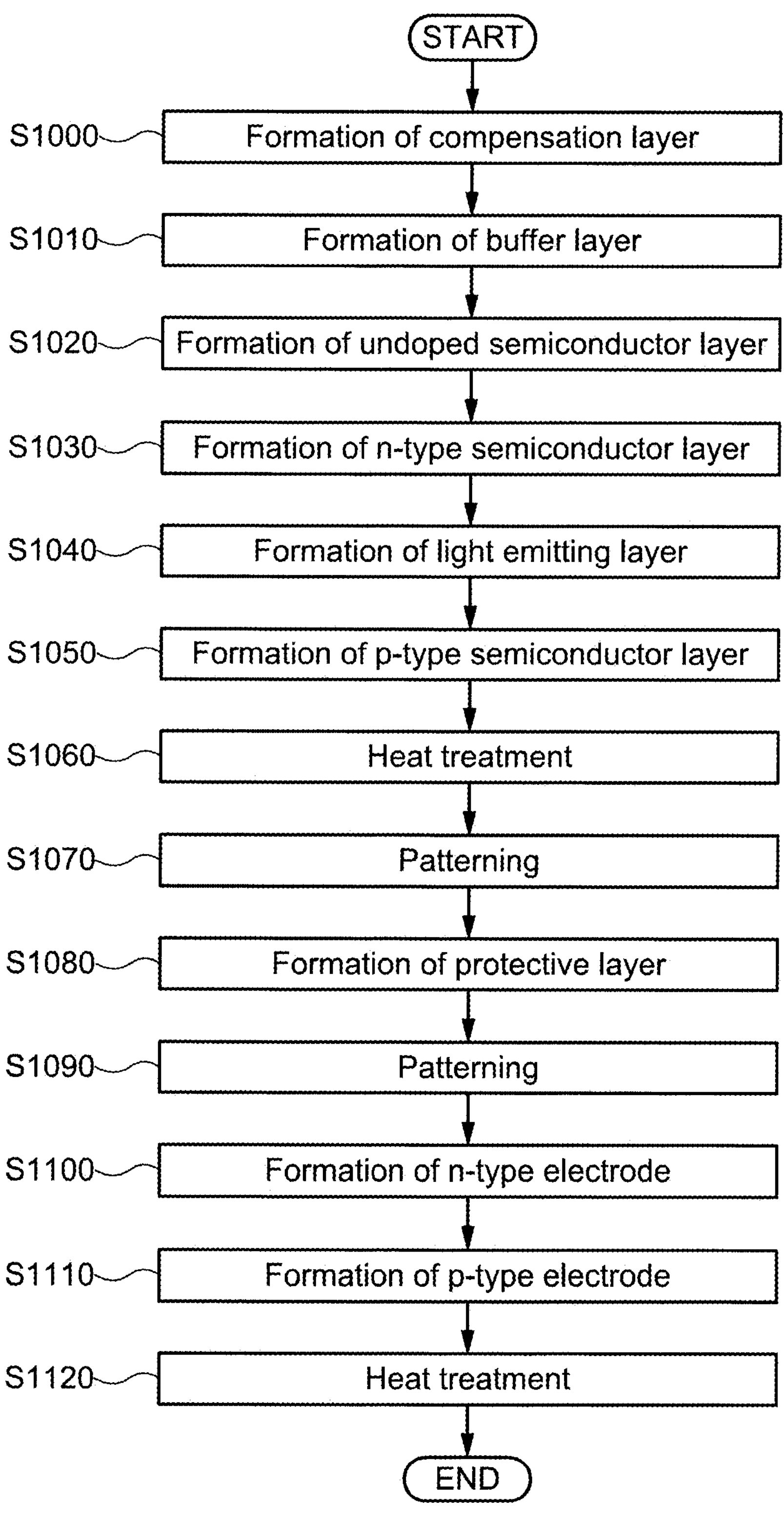
FIG. 13 is a flow chart showing a method for manufacturing a light emitting element according to an embodiment of the present invention.

FIG. 13 is a flow chart showing a method for manufacturing the light emitting device 1000 according to an embodiment of the present invention.

In step S1000, an aluminum nitride film is formed on the second surface of the substrate 1010 as the compensation layer 1020. The aluminum nitride film can be formed using the film formation apparatus 10 or another sputtering apparatus. When the deposition apparatus 10 is used, the nitrogen radicals and the hydrogen radicals may be supplied from the first radical supply source 180.

In step S1010, an aluminum nitride film is formed on the first surface of the substrate 1010 as the buffer layer 1030. The aluminum nitride film can be formed using the film formation apparatus 10 or another sputtering apparatus. When the film formation apparatus 10 is used, the nitrogen radicals and the hydrogen radicals may be supplied from the first radical supply source 180.

In step S1020, a gallium nitride film is formed on the buffer layer 1030 as the undoped semiconductor layer 1035. The gallium nitride film can be formed using the film formation apparatus 10.

In step S1030, a gallium nitride film doped with silicon is formed on the undoped semiconductor layer 1035 as the n-type semiconductor layer 1040. The gallium nitride film doped with silicon can be formed using the film formation apparatus 10. Specifically, gallium nitride doped with silicon is used as the target 130, and sputtering is performed while the nitrogen radicals and the hydrogen radicals are supplied from the first radical supply source 180.

In step S1040, indium gallium nitride films and gallium nitride films are alternately formed on the n-type semiconductor layer 1040 as the light emitting layer 1050. The indium gallium nitride films and the gallium nitride films can be formed using the film formation apparatus 10. In forming the indium gallium nitride film, indium gallium nitride is used as the target 130, and sputtering is performed while supplying the nitrogen radicals and the hydrogen radicals from the first radical supply source 180.

In step S1050, a gallium nitride film doped with magnesium is formed on the light emitting layer 1050 as the p-type semiconductor layer 1060. The gallium nitride film doped with magnesium can be formed using the film formation apparatus 10. Specifically, gallium nitride doped with magnesium is used as the target 130, and sputtering is performed while supplying the nitrogen radicals and the hydrogen radicals from the first radical supply source 180.

In step S1060, a heat treatment is performed. The activation rate of the magnesium added into the gallium nitride film in step S1050 may be low. In this case, the magnesium can be activated by performing a heat treatment to allow the layer to function as the p-type semiconductor layer 1060.

In step S1070, the p-type semiconductor layer 1060, the light emitting layer 1050, and the n-type semiconductor layer 1040 are etched into a predetermined pattern using photolithography. In addition, the n-type semiconductor layer 1040 is etched so that its surface is exposed (i.e., so that a part of the n-type semiconductor layer 1040 remains). For example, plasma etching can be used as the etching.

In step S1080, a silicon oxide film is formed as a protective layer 1070 so as to cover the surface of the p-type semiconductor layer 1060, the exposed surface of the n-type semiconductor layer 1040, and the side surfaces of each layer. The silicon oxide film can be formed using a CVD apparatus.

In step S1090, the protective layer 1070 is patterned using photolithography so as to form openings that expose the surfaces of the p-type semiconductor layer 1060 and the n-type semiconductor layer 1040.

In step S1100, a metal stacked film of Ti/Al/Ti/Au is formed on the n-type semiconductor layer 1040 through the opening as the n-type electrode 1080.

In step S1110, a metal stacked film of Ni/Au is formed on the p-type semiconductor layer 1060 through the opening as the p-type electrode 1090.

In step S1120, a heat treatment is performed. In this way, the contact resistance between the n-type semiconductor layer 1040 and the n-type electrode 1080 and the contact resistance between the p-type semiconductor layer 1060 and the p-type electrode 1090 can be reduced.

As described above, since gallium nitride films of the light emitting element 1000 according to the present embodiment are formed using the film formation apparatus 10, the semiconductor element can be manufactured using a substrate with low heat resistance, such as a glass substrate.

Fourth Embodiment

A semiconductor element 2000 according to an embodiment of the present invention is described with reference to FIGS. 14 and 15.

[1. Configuration of Semiconductor Element 2000]

Figure 14:
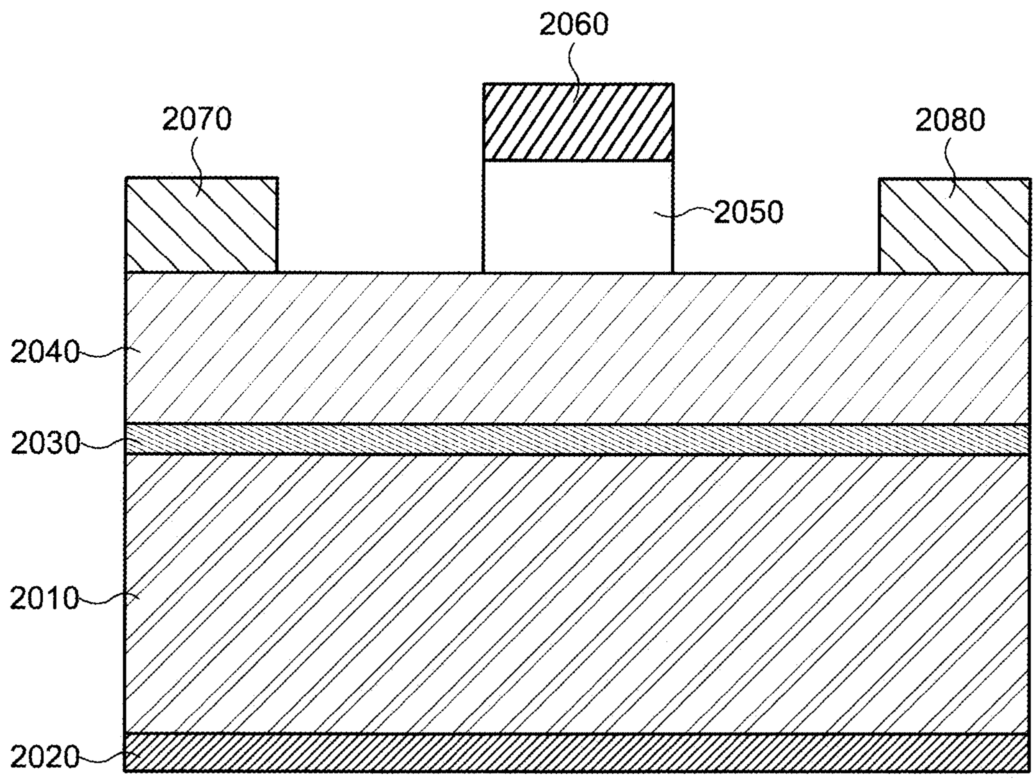
FIG. 14 is a schematic diagram showing a configuration of a semiconductor element according to an embodiment of the present invention.

FIG. 14 is a schematic diagram showing a configuration of the semiconductor element 2000 according to an embodiment of the present invention.

As shown in FIG. 13, the semiconductor element 2000 includes a substrate 2010, a compensation layer 2020, a buffer layer 2030, a semiconductor layer 2040, a gate insulating layer 2050, a gate electrode 2060, a source electrode 2070, and a drain electrode 2080. Although the semiconductor element 2000 is a so-called transistor, the semiconductor element 2000 is not limited thereto.

Since the substrate 2010, the compensation layer 2020, and the buffer layer 2030 are similar to the substrate 1010, the compensation layer 1020, and the buffer layer 1030 of the Third Embodiment, respectively, the description thereof is omitted here.

For example, a gallium nitride film doped with silicon (n-type gallium nitride semiconductor film) or a gallium nitride film (undoped gallium nitride semiconductor film) can be used as the semiconductor layer 2040. A silicon oxide film or a silicon nitride film can be used as the gate insulating layer 2050. A metal film such as aluminum (Al), nickel (Ni), titanium (Ti), gold (Au), silver (Ag), palladium (Pd), and indium (In) or a stacked metal film thereof can be used for each of the gate electrode 2060, the source electrode 2070, and the drain electrode 2080.

[2. Method for Manufacturing Semiconductor Element 2000]

Figure 15:
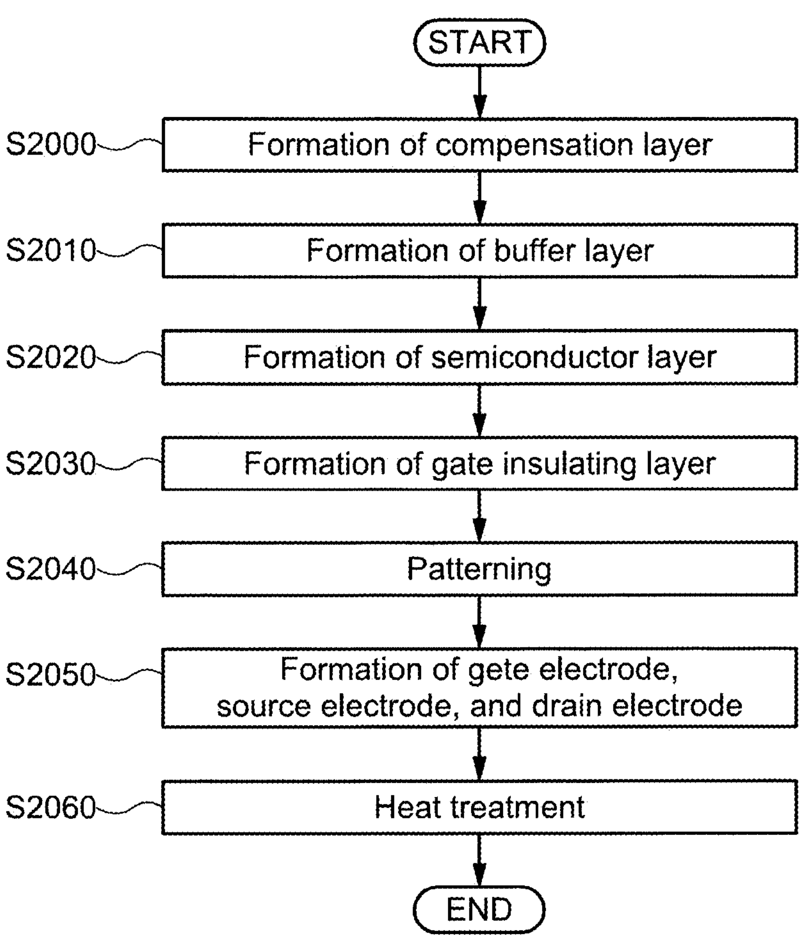
FIG. 15 is a flow chart showing a method for manufacturing a semiconductor element according to an embodiment of the present invention.

FIG. 15 is a flow chart illustrating a method for manufacturing the semiconductor element 2000 according to an embodiment of the present invention.

In step S2000, an aluminum nitride film is formed as the compensation layer 2020 on the second surface of the substrate 2010. The aluminum nitride film can be formed using the film formation apparatus 10 or another sputtering apparatus. When the film formation apparatus 10 is used, the nitrogen radicals and the hydrogen radicals may be supplied from the first radical supply source 180.

In step S2010, an aluminum nitride film is formed as the buffer layer 2030 on the first surface of the substrate 2010. The aluminum nitride film can be formed using the film formation apparatus 10 or another sputtering apparatus. When the film forming apparatus 10 is used, the nitrogen radicals and the hydrogen radicals may be supplied from the first radical supply source 180.

In step S2020, a gallium nitride film is formed as the semiconductor layer 2040 on the buffer layer 2030. The gallium nitride film can be formed using the film formation apparatus 10.

In step S2030, a silicon oxide film is formed as the gate insulating layer 2050 on the semiconductor layer 2040. The silicon oxide film can be formed using a CVD apparatus.

In step S2040, the gate insulating layer 2050 and the semiconductor layer 2040 are patterned using photolithography. The gate insulating layer 2050 is patterned so as to expose the surface of the semiconductor layer 2040. The semiconductor layer 2040 is patterned in an island shape.

In step S2050, a stacked metal film of Ti/Al is formed as the gate electrode 2060 on the gate insulating layer 2050. Further, the stacked metal film of Ti/Al is formed as the source electrode 2070 and the drain electrode 2080 on the exposed surface of the semiconductor layer 2040.

In step S2060, a heat treatment is performed. In this way, the contact resistance between the semiconductor layer 2040 and the source electrode 2070, and the contact resistance between the semiconductor layer 2040 and the drain electrode 2080 can be reduced.

As described above, since gallium nitride films of the semiconductor element 2000 according to the present embodiment are formed using the film formation apparatus 10, the semiconductor element can be manufactured using a substrate with low heat resistance, such as a glass substrate.

Each of the embodiments described above as the embodiments of the present invention can be appropriately combined and implemented as long as no contradiction is caused. Further, the addition, deletion, or design change of components, or the addition, deletion, or condition change of processes as appropriate by those skilled in the art based on each of the embodiments are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A film formation apparatus, comprising:

a vacuum chamber capable of evacuating an interior thereof;

a substrate support portion provided in the vacuum chamber and configured to support a substrate;

a target support portion provided in the vacuum chamber and configured to support a target containing nitrogen and gallium;

a sputtering gas supply unit connected to the vacuum chamber and configured to supply a sputtering gas to the vacuum chamber;

a sputtering power source configured to apply a voltage to the target;

a first radical supply source connected to the vacuum chamber and configured to be capable of supplying nitrogen radicals and hydrogen radicals to the vacuum chamber; and a control unit configured to control the sputtering gas supply unit, the sputtering power source, and the first radical supply source, wherein the control unit controls the sputtering gas supply unit, the sputtering power source, and the first radical supply source so that a first period in which the sputtering gas, the nitrogen radicals, and the hydrogen radicals are supplied to the vacuum chamber and a voltage is applied to the target and a second period in which the nitrogen radicals and the hydrogen radicals are not supplied to the vacuum chamber and a voltage is applied to the target are repeated.

2. The film formation apparatus according to claim 1, wherein in the second period, the sputtering gas is supplied to the vacuum chamber.

3. The film formation apparatus according to claim 1, wherein in the first period, the supply of the sputtering gas is started after the supply of the nitrogen radicals and the hydrogen radicals are started.

4. The film formation apparatus according to claim 3, wherein in the first period, the supply of the nitrogen radicals and the hydrogen radicals are stopped after the supply of the sputtering gas is stopped.

5. The film formation apparatus according to claim 1, further comprising a second radical supply source connected to the vacuum chamber and configured to be capable of supplying chlorine radicals to the vacuum chamber, wherein the control unit further controls the second radical supply source, and wherein in the second period, the chlorine radicals are supplied to the vacuum chamber.

6. The film formation apparatus according to claim 5, wherein in the second period, the sputtering gas is supplied to the vacuum chamber.

7. The film formation apparatus according to claim 5, wherein in the first period, the supply of the sputtering gas is started after the supply of the nitrogen radicals and the hydrogen radicals are started.

8. The film formation apparatus according to claim 7, wherein in the first period, the supply of the nitrogen radicals is started after the supply of the hydrogen radicals is started.

9. The film formation apparatus according to claim 7, wherein in the first period, the supply of the hydrogen radicals is started after the supply of the nitrogen radicals is started.

10. The film formation apparatus according to claim 7, wherein in the first period, the supply of the nitrogen radicals and the hydrogen radicals are stopped after the supply of the sputtering gas is stopped.

11. The film formation apparatus according to claim 10, wherein in the first period, the supply of the nitrogen radicals is stopped after the supply of the hydrogen radicals is stopped.

12. The film formation apparatus according to claim 10, wherein in the first period, the supply of the hydrogen radicals is stopped after the supply of the nitrogen radicals is stopped.

* * * * *